US012707964B2

(12) United States Patent
Gao et al.

(10) Patent No.: US 12,707,964 B2
(45) Date of Patent: Aug. 11, 2026

(54) STACKED INDUCTORS IN MULTI-DIE STACKING

(71) Applicant: ADEIA SEMICONDUCTOR BONDING TECHNOLOGIES INC, San Jose, CA (US)

(72) Inventors: Guilian Gao, San Jose, CA (US); Gaius Gillman Fountain, Jr., Youngsville, NC (US); Belgacem Haba, Saratoga, CA (US); Rajesh Katkar, Milpitas, CA (US)

(73) Assignee: Adeia Semiconductor Bonding Technologies Inc, San Jose, CA (US)

( * ) Notice: Subject to any disclaimer, the term of this patent is extended or adjusted under 35 U.S.C. 154(b) by 740 days.

(21) Appl. No.: 18/047,238

(22) Filed: Oct. 17, 2022

(65) Prior Publication Data

US 2023/0123423 A1 Apr. 20, 2023

Related U.S. Application Data

(60) Provisional application No. 63/262,733, filed on Oct. 19, 2021.

(51) Int. Cl.
*H01L 23/522* (2006.01)
*H01L 23/00* (2006.01)
(Continued)

(52) U.S. Cl.
CPC ......... *H10W 20/497* (2026.01); *H10W 20/20* (2026.01); *H10W 90/00* (2026.01); (Continued)

(58) Field of Classification Search
CPC ............... H01L 23/5227; H01L 23/481; H01L 2225/06544; H01L 2924/30107; (Continued)

(56) References Cited

U.S. PATENT DOCUMENTS 4,998,665 A 3/1991 Hayashi
5,087,585 A 2/1992 Hayashi
(Continued)

FOREIGN PATENT DOCUMENTS

EP 1 441 410 B1 4/2006
JP 2000-100679 4/2000
(Continued)

OTHER PUBLICATIONS

Amirfeiz et al., "Formation of silicon structures by plasma-activated wafer bonding," Journal of the Electrochemical Society, 2000, vol. 147, No. 7, pp. 2693-2698.
(Continued)

*Primary Examiner* — Mamadou L Diallo

(74) *Attorney, Agent, or Firm* — Knobbe, Martens, Olson & Bear, LLP

(57) ABSTRACT

Microelectronic devices having stacked electromagnetic coils are disclosed. In one example, a microelectronic device can include a first semiconductor element and a second semiconductor element disposed on the first semiconductor element. The microelectronic device can also include an electromagnetic coil. A first portion of the electromagnetic coil and a second portion of the electromagnetic coil may be spaced apart by the first semiconductor element. A first conductive via extending through the first semiconductor element may connect the first and second portions of the electromagnetic coil. Methods for forming such microelectronic devices are also disclosed.

20 Claims, 7 Drawing Sheets

(51) Int. Cl.
*H01L 23/48* (2006.01)
*H01L 25/065* (2023.01)
*H10W 20/20* (2026.01)
*H10W 20/40* (2026.01)
*H10W 90/00* (2026.01)
*H10W 80/00* (2026.01)
*H10W 90/20* (2026.01)
*H10W 90/26* (2026.01)

(52) U.S. Cl.
CPC ........ *H10W 80/312* (2026.01); *H10W 80/327* (2026.01); *H10W 90/20* (2026.01); *H10W 90/26* (2026.01); *H10W 90/297* (2026.01); *H10W 90/792* (2026.01)

(58) Field of Classification Search
CPC ......... H01L 2225/06541; H01L 23/645; H01L 24/08; H01L 24/80; H01L 25/0657; H01L 2224/08146; H01L 2224/80895; H01L 25/50
See application file for complete search history.

(56) References Cited

U.S. PATENT DOCUMENTS 5,322,593 A 6/1994 Hasegawa et al.
5,408,053 A 4/1995 Young
5,471,090 A 11/1995 Deutsch et al.
5,753,536 A 5/1998 Sugiyama et al.
5,771,555 A 6/1998 Eda et al.
5,785,874 A 7/1998 Eda
5,818,631 A 10/1998 Askinazi et al.
5,985,739 A 11/1999 Plettner et al.
5,998,808 A 12/1999 Matsushita
6,008,126 A 12/1999 Leedy
6,080,640 A 6/2000 Gardner et al.
6,084,714 A 7/2000 Ushiyama et al.
6,108,472 A 8/2000 Rickman et al.
6,115,264 A 9/2000 Nosaka
6,265,775 B1 7/2001 Seyyedy
6,300,161 B1 10/2001 Goetz et al.
6,374,770 B1 4/2002 Lee
6,388,896 B1 * 5/2002 Cuk .................. H02M 3/33592 363/16
6,404,550 B1 6/2002 Yajima
6,418,029 B1 7/2002 McKee et al.
6,423,640 B1 7/2002 Lee et al.
6,465,892 B1 10/2002 Suga
6,638,808 B1 10/2003 Ochi
6,713,871 B2 3/2004 Searls et al.
6,759,692 B1 7/2004 Ochi
6,887,769 B2 5/2005 Kellar et al.
6,908,027 B2 6/2005 Tolchinsky et al.
6,908,832 B2 6/2005 Farrens et al.
7,045,453 B2 5/2006 Canaperi et al.
7,078,811 B2 7/2006 Suga
7,105,980 B2 9/2006 Abbott et al.
7,126,212 B2 10/2006 Enquist et al.
7,193,423 B1 3/2007 Dalton et al.
7,339,798 B2 3/2008 Chakravorty
7,354,798 B2 4/2008 Pogge et al.
7,355,836 B2 4/2008 Radhakrishnan et al.
7,705,691 B2 4/2010 Lu et al.
7,741,724 B2 6/2010 Morikawa et al.
7,746,663 B2 6/2010 Hashimoto
7,750,488 B2 7/2010 Patti et al.
7,791,429 B2 9/2010 Chen et al.
7,803,693 B2 9/2010 Trezza
8,153,505 B2 4/2012 Tong et al.
8,183,127 B2 5/2012 Patti et al.
8,241,961 B2 8/2012 Kim et al.
8,300,312 B2 10/2012 Kobayashi et al.
8,314,007 B2 11/2012 Vaufredaz
8,349,635 B1 1/2013 Gan et al.
8,357,931 B2 1/2013 Schieck et al.
8,377,798 B2 2/2013 Peng et al.
8,441,131 B2 5/2013 Ryan
8,476,146 B2 7/2013 Chen et al.
8,476,165 B2 7/2013 Trickett et al.
8,482,132 B2 7/2013 Yang et al.
8,483,253 B2 7/2013 Budd et al.
8,501,537 B2 8/2013 Sadaka et al.
8,524,533 B2 9/2013 Tong et al.
8,620,164 B2 12/2013 Heck et al.
8,647,987 B2 2/2014 Yang et al.
8,697,493 B2 4/2014 Sadaka
8,698,323 B2 4/2014 Mohammed et al.
8,716,105 B2 5/2014 Sadaka et al.
8,802,538 B1 8/2014 Liu
8,809,123 B2 8/2014 Liu et al.
8,841,002 B2 9/2014 Tong
8,916,448 B2 12/2014 Cheng et al.
8,988,299 B2 3/2015 Kam et al.
9,093,350 B2 7/2015 Endo et al.
9,142,517 B2 9/2015 Liu
9,171,756 B2 10/2015 Enquist et al.
9,179,584 B2 11/2015 La Porta et al.
9,184,125 B2 11/2015 Enquist et al.
9,224,704 B2 12/2015 Landru
9,230,941 B2 1/2016 Chen et al.
9,257,399 B2 2/2016 Kuang et al.
9,263,186 B2 2/2016 Li et al.
9,299,736 B2 3/2016 Chen et al.
9,312,229 B2 4/2016 Chen et al.
9,331,149 B2 5/2016 Tong et al.
9,337,235 B2 5/2016 Chen et al.
9,368,866 B2 6/2016 Yu
9,385,024 B2 7/2016 Tong et al.
9,391,143 B2 7/2016 Tong et al.
9,394,161 B2 7/2016 Cheng et al.
9,431,368 B2 8/2016 Enquist et al.
9,437,572 B2 9/2016 Chen et al.
9,443,796 B2 9/2016 Chou et al.
9,461,007 B2 10/2016 Chun et al.
9,496,202 B2 11/2016 Hashimoto
9,496,239 B1 11/2016 Edelstein et al.
9,536,848 B2 1/2017 England et al.
9,537,199 B2 1/2017 Dang et al.
9,559,081 B1 1/2017 Lai et al.
9,620,481 B2 4/2017 Edelstein et al.
9,627,365 B1 * 4/2017 Yu .................... H10W 72/0198
9,656,852 B2 5/2017 Cheng et al.
9,671,572 B2 6/2017 Decker et al.
9,723,716 B2 8/2017 Meinhold
9,728,521 B2 8/2017 Tsai et al.
9,741,620 B2 8/2017 Uzoh et al.
9,744,754 B2 8/2017 Wakamatsu et al.
9,799,587 B2 10/2017 Fujii et al.
9,852,988 B2 12/2017 Enquist et al.
9,881,882 B2 1/2018 Hsu et al.
9,893,004 B2 2/2018 Yazdani
9,899,442 B2 2/2018 Katkar
9,929,050 B2 3/2018 Lin
9,941,241 B2 4/2018 Edelstein et al.
9,941,243 B2 4/2018 Kim et al.
9,953,941 B2 4/2018 Enquist
9,960,142 B2 5/2018 Chen et al.
10,002,844 B1 6/2018 Wang et al.
10,026,605 B2 7/2018 Doub et al.
10,075,657 B2 9/2018 Fahim et al.
10,204,893 B2 2/2019 Uzoh et al.
10,269,756 B2 4/2019 Uzoh
10,276,619 B2 4/2019 Kao et al.
10,276,909 B2 4/2019 Huang et al.
10,418,277 B2 9/2019 Cheng et al.
10,446,487 B2 10/2019 Huang et al.
10,446,532 B2 10/2019 Uzoh et al.
10,508,030 B2 12/2019 Katkar et al.
10,522,499 B2 12/2019 Enquist et al.
10,571,699 B1 2/2020 Parsons et al.
10,707,087 B2 7/2020 Uzoh et al.
10,784,191 B2 9/2020 Huang et al.
10,790,262 B2 9/2020 Uzoh et al.

(56) References Cited

U.S. PATENT DOCUMENTS 10,840,135 B2 11/2020 Uzoh
10,840,205 B2 11/2020 Fountain, Jr. et al.
10,854,578 B2 12/2020 Morein
10,879,212 B2 12/2020 Uzoh et al.
10,886,177 B2 1/2021 DeLaCruz et al.
10,892,246 B2 1/2021 Uzoh
10,923,408 B2 2/2021 Huang et al.
10,923,413 B2 2/2021 DeLaCruz
10,950,547 B2 3/2021 Mohammed et al.
10,964,664 B2 3/2021 Mandalapu et al.
10,985,133 B2 4/2021 Uzoh
10,991,804 B2 4/2021 DeLaCruz et al.
10,998,292 B2 5/2021 Lee et al.
11,004,757 B2 5/2021 Katkar et al.
11,011,494 B2 5/2021 Gao et al.
11,011,503 B2 5/2021 Wang et al.
11,031,285 B2 6/2021 Katkar et al.
11,056,348 B2 7/2021 Theil
11,088,099 B2 8/2021 Katkar et al.
11,127,738 B2 9/2021 DeLaCruz et al.
11,158,606 B2 10/2021 Gao et al.
11,171,117 B2 11/2021 Gao et al.
11,176,450 B2 11/2021 Teig et al.
11,256,004 B2 2/2022 Haba et al.
11,264,357 B1 3/2022 DeLaCruz et al.
11,276,676 B2 3/2022 Enquist et al.
11,296,044 B2 4/2022 Gao et al.
11,329,034 B2 5/2022 Tao et al.
11,348,898 B2 5/2022 DeLaCruz et al.
11,355,443 B2 6/2022 Huang et al.
2002/0000328 A1 1/2002 Motomura et al.
2002/0003307 A1 1/2002 Suga
2002/0131715 A1 9/2002 Brady
2003/0081906 A1 5/2003 Filhaber et al.
2003/0168716 A1 9/2003 Lee et al.
2004/0071424 A1 4/2004 Hiraka et al.
2004/0084414 A1 5/2004 Sakai et al.
2004/0149991 A1 8/2004 Won
2004/0155692 A1 8/2004 Ochi
2004/0207043 A1 10/2004 Matsunaga et al.
2004/0226910 A1 11/2004 Chatterjee et al.
2005/0063134 A1 3/2005 Kim et al.
2005/0135041 A1 6/2005 Kang et al.
2005/0190808 A1 9/2005 Yonekura et al.
2005/0231303 A1 10/2005 Chang et al.
2006/0012966 A1 1/2006 Chakravorty
2006/0017144 A1 1/2006 Uematsu et al.
2006/0057945 A1 3/2006 Hsu et al.
2006/0145778 A1 7/2006 Pleva et al.
2007/0045814 A1 3/2007 Yamamoto et al.
2007/0085165 A1 4/2007 Oh et al.
2007/0096294 A1 5/2007 Ikeda et al.
2007/0111386 A1 5/2007 Kim et al.
2007/0147014 A1 6/2007 Chang et al.
2007/0194427 A1* 8/2007 Choi .................... H10W 90/00 257/E23.125
2007/0222048 A1 9/2007 Huang
2007/0295456 A1 12/2007 Gudeman et al.
2008/0124835 A1 5/2008 Chen et al.
2009/0206962 A1 8/2009 Chou et al.
2009/0242252 A1 10/2009 Tanaka
2011/0115579 A1 5/2011 Rofougaran
2011/0290552 A1 12/2011 Palmateer et al.
2012/0013499 A1 1/2012 Hayata
2012/0100318 A1 4/2012 Danzl et al.
2012/0147516 A1 6/2012 Kim et al.
2012/0168217 A1 7/2012 Hsu et al.
2012/0212384 A1 8/2012 Kam et al.
2013/0009325 A1 1/2013 Mori et al.
2013/0063863 A1 3/2013 Timler et al.
2013/0105943 A1 5/2013 Lai et al.
2013/0161811 A1 6/2013 Yang et al.
2013/0207234 A1 8/2013 Ikeda et al.
2013/0250430 A1 9/2013 Robbins et al.
2013/0265733 A1 10/2013 Herbsommer et al.
2013/0286544 A1 10/2013 Azais
2014/0001568 A1 1/2014 Wang et al.
2014/0048908 A1 2/2014 Chen et al.
2014/0071519 A1 3/2014 Chen et al.
2014/0116761 A1 5/2014 Lee et al.
2014/0145338 A1 5/2014 Fujii et al.
2014/0175629 A1 6/2014 Sun et al.
2014/0175655 A1 6/2014 Chen et al.
2014/0177189 A1 6/2014 Liu et al.
2014/0184351 A1 7/2014 Bae et al.
2014/0225795 A1 8/2014 Yu
2014/0252635 A1 9/2014 Tran et al.
2014/0264751 A1 9/2014 Chen et al.
2014/0264948 A1 9/2014 Chou et al.
2014/0294342 A1 10/2014 Offrein et al.
2014/0370658 A1 12/2014 Tong et al.
2014/0377946 A1 12/2014 Cha et al.
2015/0064498 A1 3/2015 Tong
2015/0097298 A1 4/2015 Chen et al.
2015/0194379 A1 7/2015 Chen et al.
2015/0206902 A1 7/2015 Cheng et al.
2015/0221571 A1 8/2015 Chaparala et al.
2015/0235952 A1* 8/2015 Pan .................... H10W 70/611 361/783
2015/0270209 A1 9/2015 Woychik et al.
2015/0318618 A1 11/2015 Chen et al.
2015/0328875 A1 11/2015 Hattori et al.
2016/0077294 A1 3/2016 Jou et al.
2016/0093583 A1 3/2016 Yu et al.
2016/0111404 A1 4/2016 Sanders et al.
2016/0155677 A1 6/2016 Bonart et al.
2016/0197630 A1 7/2016 Kawasaki
2016/0233195 A1 8/2016 Nagai
2016/0254345 A1 9/2016 Singh et al.
2016/0291265 A1 10/2016 Kinghorn et al.
2016/0309578 A1 10/2016 Park
2016/0343682 A1 11/2016 Kawasaki
2016/0372449 A1 12/2016 Rusu et al.
2017/0019086 A1 1/2017 Dueweke
2017/0062409 A1 3/2017 Basker et al.
2017/0179029 A1 6/2017 Enquist et al.
2017/0194271 A1 7/2017 Hsu et al.
2017/0207600 A1 7/2017 Klamkin et al.
2017/0315299 A1 11/2017 Mathai et al.
2017/0338214 A1 11/2017 Uzoh et al.
2017/0343498 A1 11/2017 Kalnitsky et al.
2017/0345754 A1* 11/2017 Yun .................... H10W 20/497
2018/0034514 A1 2/2018 Iwakura
2018/0120568 A1 5/2018 Miller et al.
2018/0156965 A1 6/2018 El-Ghoroury et al.
2018/0175012 A1 6/2018 Wu et al.
2018/0182639 A1 6/2018 Uzoh et al.
2018/0182666 A1 6/2018 Uzoh et al.
2018/0190580 A1 7/2018 Haba et al.
2018/0190583 A1 7/2018 DeLaCruz et al.
2018/0191047 A1 7/2018 Huang et al.
2018/0219038 A1 8/2018 Gambino et al.
2018/0261645 A1 9/2018 Na et al.
2018/0277516 A1 9/2018 Kume
2018/0277523 A1 9/2018 Ahmed et al.
2018/0286805 A1 10/2018 Huang et al.
2018/0323177 A1 11/2018 Yu et al.
2018/0323227 A1 11/2018 Zhang et al.
2018/0331066 A1 11/2018 Uzoh et al.
2019/0018245 A1 1/2019 Cheng et al.
2019/0088633 A1 3/2019 Tao et al.
2019/0096741 A1 3/2019 Uzoh et al.
2019/0115277 A1 4/2019 Yu et al.
2019/0131277 A1 5/2019 Yang et al.
2019/0198409 A1 6/2019 Katkar et al.
2019/0265411 A1 8/2019 Huang et al.
2019/0333550 A1 10/2019 Fisch
2019/0385935 A1 12/2019 Gao et al.
2019/0385966 A1 12/2019 Gao et al.
2019/0385980 A1* 12/2019 Chen ....................... H10D 1/20
2020/0013637 A1 1/2020 Haba
2020/0013765 A1 1/2020 Fountain, Jr. et al.
2020/0035641 A1 1/2020 Fountain, Jr. et al.
2020/0043817 A1 2/2020 Shen et al.

(56) References Cited

U.S. PATENT DOCUMENTS

2020/0075553 A1 3/2020 DeLaCruz et al.
2020/0118973 A1 4/2020 Wang et al.
2020/0126906 A1 4/2020 Uzoh et al.
2020/0194396 A1 6/2020 Uzoh
2020/0227367 A1 7/2020 Haba et al.
2020/0243380 A1 7/2020 Uzoh et al.
2020/0258852 A1 8/2020 Gomes et al.
2020/0279821 A1 9/2020 Haba et al.
2020/0294908 A1 9/2020 Haba et al.
2020/0328162 A1 10/2020 Haba et al.
2020/0328164 A1 10/2020 DeLaCruz et al.
2020/0328165 A1 10/2020 DeLaCruz et al.
2020/0335408 A1 10/2020 Gao et al.
2020/0365575 A1 11/2020 Uzoh et al.
2020/0371154 A1 11/2020 DeLaCruz et al.
2020/0395321 A1 12/2020 Katkar et al.
2020/0411483 A1 12/2020 Uzoh et al.
2020/0411587 A1 12/2020 Pezeshki et al.
2021/0098412 A1 4/2021 Haba et al.
2021/0118864 A1 4/2021 DeLaCruz et al.
2021/0143125 A1 5/2021 DeLaCruz et al.
2021/0181510 A1 6/2021 Katkar et al.
2021/0193603 A1 6/2021 Katkar et al.
2021/0193624 A1 6/2021 DeLaCruz et al.
2021/0193625 A1 6/2021 DeLaCruz et al.
2021/0233893 A1* 7/2021 Greco .................. H10W 90/00
2021/0242152 A1 8/2021 Fountain, Jr. et al.
2021/0296282 A1 9/2021 Gao et al.
2021/0305202 A1 9/2021 Uzoh et al.
2021/0366820 A1 11/2021 Uzoh
2021/0407941 A1 12/2021 Haba
2022/0043209 A1 2/2022 Huang et al.
2022/0077063 A1 3/2022 Haba
2022/0077087 A1 3/2022 Haba
2022/0139867 A1 5/2022 Uzoh
2022/0139869 A1 5/2022 Gao et al.
2022/0155490 A1 5/2022 Haba et al.
2022/0165665 A1* 5/2022 Chang ................. H10W 20/493
2022/0189917 A1* 6/2022 Balboni ................ H10W 20/20
2022/0208650 A1 6/2022 Gao et al.
2022/0208702 A1 6/2022 Uzoh
2022/0208723 A1 6/2022 Katkar et al.
2022/0246497 A1 8/2022 Fountain, Jr. et al.
2022/0285303 A1 9/2022 Mirkarimi et al.
2022/0319901 A1 10/2022 Suwito et al.
2022/0320035 A1 10/2022 Uzoh et al.
2022/0320036 A1 10/2022 Gao et al.
2022/0415555 A1* 12/2022 Dogiamis ........... H01F 27/2804
2023/0005850 A1 1/2023 Fountain, Jr.
2023/0019869 A1 1/2023 Mirkarimi et al.
2023/0036441 A1 2/2023 Haba et al.
2023/0067677 A1 3/2023 Lee et al.
2023/0069183 A1 3/2023 Haba
2023/0100032 A1 3/2023 Haba et al.
2023/0115122 A1 4/2023 Uzoh et al.
2023/0122531 A1 4/2023 Uzoh
2023/0125395 A1 4/2023 Gao et al.
2023/0130259 A1 4/2023 Haba et al.
2023/0132632 A1 5/2023 Katkar et al.
2023/0140107 A1 5/2023 Uzoh et al.
2023/0142680 A1 5/2023 Guevara et al.
2023/0154816 A1 5/2023 Haba et al.
2023/0154828 A1 5/2023 Haba et al.
2023/0187264 A1 6/2023 Uzoh et al.
2023/0187317 A1 6/2023 Uzoh
2023/0187412 A1 6/2023 Gao et al.
2023/0197453 A1 6/2023 Fountain, Jr. et al.
2023/0197496 A1 6/2023 Theil
2023/0197559 A1 6/2023 Haba et al.
2023/0197560 A1 6/2023 Katkar et al.
2023/0197655 A1 6/2023 Theil et al.
2023/0207402 A1 6/2023 Fountain, Jr. et al.
2023/0207437 A1 6/2023 Haba
2023/0207474 A1 6/2023 Uzoh et al.
2023/0207514 A1 6/2023 Gao et al.
2023/0215836 A1 7/2023 Haba et al.
2023/0245950 A1 8/2023 Haba et al.
2023/0268300 A1 8/2023 Uzoh et al.
2023/0299029 A1 9/2023 Theil et al.
2023/0343734 A1 10/2023 Uzoh et al.
2023/0360950 A1 11/2023 Gao
2023/0361074 A1 11/2023 Uzoh et al.
2023/0369136 A1 11/2023 Uzoh et al.
2023/0375613 A1 11/2023 Haba et al.
2024/0038702 A1 2/2024 Uzoh
2024/0055407 A1 2/2024 Workman
2024/0079376 A1 3/2024 Suwito et al.
2024/0105674 A1 3/2024 Uzoh et al.
2024/0170411 A1 5/2024 Chang et al.
2024/0186248 A1 6/2024 Haba et al.
2024/0186268 A1 6/2024 Uzoh et al.
2024/0186269 A1 6/2024 Haba
2024/0203917 A1 6/2024 Katkar et al.
2024/0213191 A1 6/2024 Theil et al.
2024/0213210 A1 6/2024 Haba et al.
2024/0217210 A1 7/2024 Zhao et al.
2024/0222239 A1 7/2024 Gao et al.
2024/0222315 A1 7/2024 Uzoh
2024/0222319 A1 7/2024 Gao et al.
2024/0266255 A1 8/2024 Haba et al.
2024/0298454 A1 9/2024 Haba
2024/0304593 A1 9/2024 Uzoh
2024/0312951 A1 9/2024 Theil et al.
2024/0332184 A1 10/2024 Katkar et al.
2024/0332227 A1 10/2024 Uzoh et al.
2024/0332231 A1 10/2024 Uzoh
2024/0332267 A1 10/2024 Haba et al.
2024/0387419 A1 11/2024 Mrozek et al.
2025/0004197 A1 1/2025 Haba et al.
2025/0006632 A1 1/2025 Chang et al.
2025/0006642 A1 1/2025 Haba et al.
2025/0006674 A1 1/2025 Uzoh et al.
2025/0006679 A1 1/2025 Theil et al.
2025/0006689 A1 1/2025 Uzoh et al.
2025/0054854 A1 2/2025 Katkar et al.
2025/0079364 A1 3/2025 Uzoh et al.
2025/0096191 A1 3/2025 Gao et al.
2025/0112123 A1 4/2025 Katkar et al.
2025/0185163 A1 6/2025 Zhao et al.
2025/0210585 A1 6/2025 Fountain, Jr. et al.
2025/0212554 A1 6/2025 Katkar et al.
2025/0218903 A1 7/2025 Uzoh et al.

FOREIGN PATENT DOCUMENTS

JP 2001-102479 4/2001
JP 2002-353416 12/2002
JP 2003-043281 2/2003
JP 2007-041117 2/2007
JP 2008-258258 10/2008
JP 2010-276940 12/2010
JP 2013-33786 2/2013
JP 2018-160519 10/2018
KR 10-2006-0105797 10/2006
KR 10-2015-0097798 8/2015
WO WO 2005/043584 A2 5/2005
WO WO 2005/064646 A2 7/2005
WO WO 2006/100444 A1 9/2006
WO WO 2012/125237 A2 9/2012
WO WO 2017/151442 A1 9/2017

OTHER PUBLICATIONS

Bajwa, Rayan et al., "Integrated on-chip transformers: Recent progress in the design, layout, modeling and fabrication," Sensors, 2019, vol. 19, pp. 3535-3559.

Chung et al., "Room temperature GaAseu + Si and InPeu + Si wafer direct bonding by the surface activate bonding method," Nuclear Instruments and Methods in Physics Research Section B: Beam Interactions with Materials and Atoms, Jan. 2, 1997, vol. 121, Issues 1-4, pp. 203-206.

(56) References Cited

OTHER PUBLICATIONS

Chung et al., "Wafer direct bonding of compound semiconductors and silicon at room temperature by the surface activated bonding method," Applied Surface Science, Jun. 2, 1997, vols. 117-118, pp. 808-812.
Farrens et al., "Chemical free room temperature wafer to wafer direct bonding," J. Electrochem. Soc., The Electrochemical Society, Inc., Nov. 1995, vol. 142, No. 11. pp. 3949-3955.
Farrens et al., "Chemical free wafer bonding of silicon to glass and sapphire," Electrochemical Society Proceedings vol. 95-7, 1995, pp. 72-77.
Gösele et al., "Semiconductor Wafer Bonding: A flexible approach to materials combinations in microelectronics; micromechanics and optoelectronics," IEEE, 1997, pp. 23-32.
Hosoda et al., "Effect of the surface treatment on the room-temperature bonding of Al to Si and SiO2," Journal of Materials Science, Jan. 1, 1998, vol. 33, Issue 1, pp. 253-258.
Hosoda et al., "Room temperature GaAs—Si and InP—Si wafer direct bonding by the surface activated bonding method," Nuclear Inst. And Methods in Physics Research B, 1997, vol. 121, Nos. 1-4, pp. 203-206.
Howlader et al., "A novel method for bonding of ionic wafers," Electronics Components and Technology Conference, 2006, IEEE, pp. 7-pp.
Howlader et al., "Bonding of p-Si/n-InP wafers through surface activated bonding method at room temperature," Indium Phosphide and Related Materials, 2001, IEEE International Conference on, pp. 272-275.
Howlader et al., "Characterization of the bonding strength and interface current of p-Si/ n-InP wafers bonded by surface activated bonding method at room temperature," Journal of Applied Physics, Mar. 1, 2002, vol. 91, No. 5, pp. 3062-3066.
Howlader et al., "Investigation of the bonding strength and interface current of p-SionGaAs wafersbonded by surface activated bonding at room temperature," J. Vac. Sci. Technol. B 19, Nov./Dec. 2001, pp. 2114-2118.
International Search Report and Written Opinion mailed Feb. 9, 2023, issued in International Application No. PCT/US2022/078231, 11 pages.
Itoh et al., "Characteristics of fritting contacts utilized for micromachined wafer probe cards," 2000 American Institute of Physics, AIP Review of Scientific Instruments, vol. 71, 2000, pp. 2224.
Itoh et al., "Characteristics of low force contact process for MEMS probe cards," Sensors and Actuators A: Physical, Apr. 1, 2002, vols. 97-98, pp. 462-467.
Itoh et al., "Development of MEMS IC probe card utilizing fritting contact," Initiatives of Precision Engineering at the Beginning of a Millennium: 10th International Conference on Precision Engineering (ICPE) Jul. 18-20, 2001, Yokohama, Japan, 2002, Book Part 1, pp. 314-318.
Itoh et al., "Room temperature vacuum sealing using surface activated bonding method," The 12th International Conference on Solid State Sensors, Actuators and Microsystems, Boston, Jun. 8-12, 2003, 2003 IEEE, pp. 1828-1831.
Jeon, Y. et al., "Design of an on-interposer passive equalizer for high bandwidth memory (HBM) with 30Gbps data transmission," Electronic Components and Technology Conference (ECTC), 2016 IEEE 66th, Aug. 18, 2016.
Ker, Ming-Dou et al., "Fully process-compatible layout design on bond pad to improve wire bond reliability in CMOS Ics," IEEE Transactions on Components and Packaging Technologies, Jun. 2002, vol. 25, No. 2, pp. 309-316.
Kim et al., "Low temperature direct Cu—Cu bonding with low energy ion activation method," Electronic Materials and Packaging, 2001, IEEE, pp. 193-195.
Kim et al., "Room temperature Cu—Cu direct bonding using surface activated bonding method," J. Vac. Sci. Technol., 2003 American Vacuum Society, Mar./Apr. 2003, vol. 21, No. 2, pp. 449-453.
Kim et al., "Wafer-scale activated bonding of Cu—Cu, Cu—Si, and Cu—SiO2 at low temperature," Proceedings—Electrochemical Society, 2003, vol. 19, pp. 239-247.
Kim, H. et al., "A wideband on-interposer passive equalizer design for chip-to-chip 30-Gb/s serial data transmission," IEEE Transactions on Components, Packaging and Manufacturing Technology, Jan. 2015, vol. 5, Issue 1, pp. 28-39.
Lee, H. et al., "Signal integrity of bump-less high-speed through silicon via channel for terabyte/s bandwidth 2.5D IC," 2016 IEEE 66th Electronic Components and Technology Conference, Aug. 18, 2016.
Matsuzawa et al., "Room-temperature interconnection of electroplated Au microbump by means of surface activated bonding method," Electornic Components and Technology Confererence, 2001, 51st Proceedings, IEEE, pp. 384-387.
Moriceau, H. et al., "Overview of recent direct wafer bonding advances and applications," Advances in Natural Sciences-Nanoscience and Nanotechnology, 2010, 11 pages.
Nakanishi, H. et al., "Studies on SiO2—SiO2 bonding with hydrofluoric acid. Room temperature and low stress bonding technique for MEMS," Sensors and Actuators, 2000, vol. 79, pp. 237-244.
Oberhammer, J. et al., "Sealing of adhesive bonded devices on wafer level," Sensors and Actuators A, 2004, vol. 110, No. 1-3, pp. 407-412, see pp. 407-412, and Figures 1 (a)-1(l), 6 pages.
Onodera et al., "The effect of prebonding heat treatment on the separability of Au wire from Ag-plated Cu alloy substrate," Electronics Packaging Manufacturing, IEEE Transactions, Jan. 2002, vol. 25, Issue 1, pp. 5-12.
Plobi, A. et al., "Wafer direct bonding: tailoring adhesion between brittle materials," Materials Science and Engineering Review Journal, 1999, R25, 88 pages.
Reiche et al., "The effect of a plasma pretreatment on the Si/Si bonding behaviouir," Electrochemical Society Proceedings, 1998, vol. 97-36, pp. 437-444.
Roberds et al., "Low temperature , in situ, plasma activated wafer bonding," Electrochecmical Society Proceedings, 1997, vol. 97-36, pp. 598-606.
Shigetou et al., "Room temperature bonding of ultra-fine pitch and low-profiled Cu electrodes for bump-less interconnect," 2003 Electronic Components and Technology Conference, pp. 848-852.
Shigetou et al., "Room-temperature direct bonding of CMP-Cu film for bumpless interconnection," Electronic Components and Technology Confererence, 51st Proceedings, 2001, IEEE, pp. 755-760.
Shingo et al., "Design and fabrication of an electrostatically actuated MEMS probe card," Tranducers, Solid-State Sensors, Actuators and Microsystems, 12th International Conference, Jun. 8-12, 2003, vol. 2, pp. 1522-1525.
Suga et al., "A new approach to Cu—Cu direct bump bonding," IEMT/IMC Symposium, 1997, Joint International Electronic Manufacturing Symposium and the International Microelectronics Conference, Apr. 16-18, 1997, IEEE, pp. 146-151.
Suga et al., "A new bumping process using lead-free solder paste," Electronics Packaging Manufacturing, IEEE Transactions on (vol. 25, Issue 4), IEEE, Oct. 2002, pp. 253-256.
Suga et al., "A new wafer-bonder of ultra-high precision using surface activated bonding (SAB) concept," Electronic Components and Technology Conference, 2001, IEEE, pp. 1013-1018.
Suga et al., "Bump-less interconnect for next generation system packaging," Electronic Components and Technology Conference, 2001, IEEE, pp. 1003-1008.
Suga, T., "Feasibility of surface activated bonding for ultra-fine pitch interconnection—A new concept of bump-less direct bonding for system level packaging," The University of Tokyo, Research Center for Science and Technology, 2000 Electronic Components and Technology Conference, 2000 IEEE, pp. 702-705.
Suga, T., "Room-temperature bonding on metals and ceramics," Proceedings of the Second International Symposium on Semiconductor Wafer Bonding: Science, Technology and Applications, The Electrochemical Society Proceedings, vol. 93-29 (1993), pp. 71-80.
Suga et al., "Surface activated bonding—an approach to joining at room temperature," Ceramic Transactions: Structural Ceramics Joining II, The American Ceramic Society, 1993, pp. 323-331.

(56) References Cited

OTHER PUBLICATIONS

Suga et al., "Surface activated bonding for new flip chip and bumpless interconnect systems," Electronic Components and Technology Conference, 2002, IEEE, pp. 105-111.
Suga, "UHV room temperature joining by the surface activated bonding method," Advances in science and technology, Techna, Faenza, Italie, 1999, pp. C1079-C1089.
Takagi et al., "Effect of surface roughness on room-temperature wafer bonding by Ar beam surface activation," Japanese Journal of Applied Physics, 1998, vol. 37, Part 1, No. 1, pp. 4197.
Takagi et al., "Low temperature direct bonding of silicon and silicon dioxide by the surface activation method," Solid State Sensors and Actuators, 1997, Transducers '97 Chicago, 1997 International Conference, vol. 1, pp. 657-660.
Takagi et al., "Room-temperature bonding of lithium niobate and silicon wafers by argon-beam surface activation," Appl. Phys. Lett., 1999. vol. 74, pp. 2387.
Takagi et al., "Room temperature silicon wafer direct bonding in vacuum by Ar beam irradiation," Micro Electro Mehcanical Systems, MEMS '97 Proceedings, 1997, IEEE, pp. 191-196.
Takagi et al., "Room-temperature wafer bonding of Si to LiNbO3, LiTaO3 and Gd3Ga5O12 by Ar-beam surface activation," Journal of Micromechanics and Microengineering, 2001, vol. 11, No. 4, pp. 348.
Takagi et al., "Room-temperature wafer bonding of silicon and lithium niobate by means of arbon-beam surface activation," Integrated Ferroelectrics: An International Journal, 2002, vol. 50, Issue 1, pp. 53-59.
Takagi et al., "Surface activated bonding silicon wafers at room temperature," Appl. Phys. Lett. 68, 2222 (1996).
Takagi et al, "Wafer-scale room-temperature bonding between silicon and ceramic wafers by means of argon-beam surface activation," Micro Electro Mechanical Systems, 2001, MEMS 2001, The 14th IEEE International Conference, Jan. 25, 2001, IEEE, pp. 60-63.
Takagi et al., "Wafer-scale spontaneous bonding of silicon wafers by argon-beam surface activation at room temperature," Sensors and Actuators A: Physical, Jun. 15, 2003, vol. 105, Issue 1, pp. 98-102.
Tong et al., "Low temperature wafer direct bonding," Journal of Microelectomechanical systems, Mar. 1994, vol. 3, No. 1, pp. 29-35.
Topol et al., "Enabling technologies for wafer-level bonding of 3D MEMS and integrated circuit structures," 2004 Electronics Components and Technology Conference, 2004 IEEE, pp. 931-938.
Wang et al., "Reliability and microstructure of Au—Al and Au—Cu direct bonding fabricated by the Surface Activated Bonding," Electronic Components and Technology Conference, 2002, IEEE, pp. 915-919.
Wang et al., "Reliability of Au bump—Cu direct interconnections fabricated by means of surface activated bonding method," Microelectronics Reliability, May 2003, vol. 43, Issue 5, pp. 751-756.
Weldon et al., "Physics and chemistry of silicon wafer bonding investigated by infrared absorption spectroscopy," Journal of Vacuum Science & Technology B, Jul./Aug. 1996, vol. 14, No. 4, pp. 3095-3106.
Westphal, W.B. et al., "Dielectric constant and loss data," Air Force Materials Laboratory, Apr. 1972.
Xu et al., "New Au—Al interconnect technology and its reliability by surface activated bonding," Electronic Packaging Technology Proceedings, Oct. 28-30, 2003, Shanghai, China, pp. 479-483.
Ceramic Microstructures: Control at the Atomic Level, Recent Progress in Surface Activated Bonding, 1998, pp. 385-389.
Bush, Steve, "Electronica: Automotive power modules from on Semi," ElectronicsWeekly.com, indicating an ONSEMI AR0820 product was to be demonstrated at a Nov. 2018 trade show, https://www.electronicsweekly.com/news/products/power-supplies/electronica-automotive-power-modules-semi-2018-11/ (published Nov. 8, 2018; downloaded Jul. 26, 2023).
Morrison, Jim et al., "Samsung Galaxy S7 Edge Teardown," Tech Insights (posted Apr. 24, 2016), includes description of hybrid bonded Sony IMX260 dual-pixel sensor, https://www.techinsights.com/blog/samsung-galaxy-s7-edge-teardown, downloaded Jul. 11, 2023, 9 pages.
ONSEMI AR0820 image, cross section of a CMOS image sensor product. The part in the image was shipped on Sep. 16, 2021. Applicant makes no representation that the part in the image is identical to the part identified in the separately submitted reference BUSH, Nov. 8, 2018, ElectronicsWeekly.com ("BUSH article"); however, the imaged part and the part shown in the Bush article share the part number "ONSEMI AR0820."
Sony IMX260 image, cross section of Sony dual-pixel sensor product labeled IMX260, showing peripheral probe and wire bond pads in a bonded structure. The part in the image was shipped in Apr. 2016. Applicant makes no representation that the part in the image is identical to the part identified in the separately submitted reference Morrison et al. (Tech Insights article dated Apr. 24, 2016), describing and showing a similar sensor product within the Samsung Galaxy S7; however the imaged part and the part shown in the Morrison et al. article share the part name "Sony IMX260."
European Extended Search Report dated Jul. 16, 2025 in Application No. 22884625.9, 9 pages.

* cited by examiner 105
144
142
106
148
158
147
154
146
153C
145
153B
153A
152
157
156
155

STACKED INDUCTORS IN MULTI-DIE STACKING

CROSS REFERENCE TO RELATED APPLICATION

This patent application claims the benefit of U.S. Provisional Application No. 63/262,733, filed Oct. 19, 2021, the entire contents of which are hereby incorporated by reference in their entirety and all purposes.

BACKGROUND

Field

The field relates to microelectronics with integrated passive components.

Description of the Related Art

Passive electronic components, such as capacitors, resistors, and inductors, play important roles in electronic systems. For example, passive components help transform signals and increase the performance of active devices in a system. However, there may be a need for reducing power consumption or undesired coupling when using passive components. Moreover, on-chip integration of passive electronic components may encounter geometry or wiring design constraints. Accordingly, there remains a continuing need for improved design of passive electronic components in integrated electronic systems.

BRIEF DESCRIPTION OF THE DRAWINGS

Specific implementations will now be described with reference to the following drawings, which are provided by way of example, and not limitation.

DETAILED DESCRIPTION

On-chip inductors, or electromagnetic coils, used in integrated circuit technology may be fabricated within the back end of line (BEOL) layers of an active device. Such inductors and/or electromagnetic coils may be formed of thin metal lines, for example metal lines with a thickness of about 0.2 μm. Further, since in such an inductor each coil portion is formed within a single BEOL layer, the distance between adjacent coil portions is very small. Therefore, such inductors may suffer from low efficiency due to the high electrical resistance resulting from the thin metal lines and the high self-capacitive coupling, or the so-called parasitic capacitance, between the coil portions because the coil portions are tightly packed together. Accordingly, there remains a continuing need for improved design of on-chip inductors.

Disclosed are microelectronics with integrated inductors, or electromagnetic coils, which can achieve a high Q value (quality factor), a low resistance and/or a low self-coupling capacitance. In one embodiment, disclosed is an electromagnetic coil that spans, e.g., vertically spans, multiple back end of line (BEOL) layers of stacked chips. For example, a microelectronic system may include an electromagnetic coil embedded in at least two chips, or semiconductor elements, and at least one semiconductor element or a semiconductor substrate of a chip is located between the adjacent two coil portions of the electromagnetic coil. In the context of this disclosure, a back end of line (BEOL) layer may include one or more layers of conductive materials to provide electrical features and may further include one or more dielectric material layers to insulate the conductive features. In some embodiments, the BEOL layers may be fabricated as part of a wafer fabrication that includes an outermost layer (or close to the outermost layer with an embedded coil portion. In some embodiments, the BEOL layers formed in wafer fabrication may not contain the coil portion, and the coil portion may be added later as part of a routing layer or bonding layer. Accordingly, in various embodiments, the coil portion(s) can be embedded in any suitable metallization or routing layers. The dielectric material of the BEOL layer(s) can comprise an inorganic dielectric, such as silicon oxide, silicon nitride, silicon oxynitride, silicon oxycarbonitride, etc.

Figure 1:
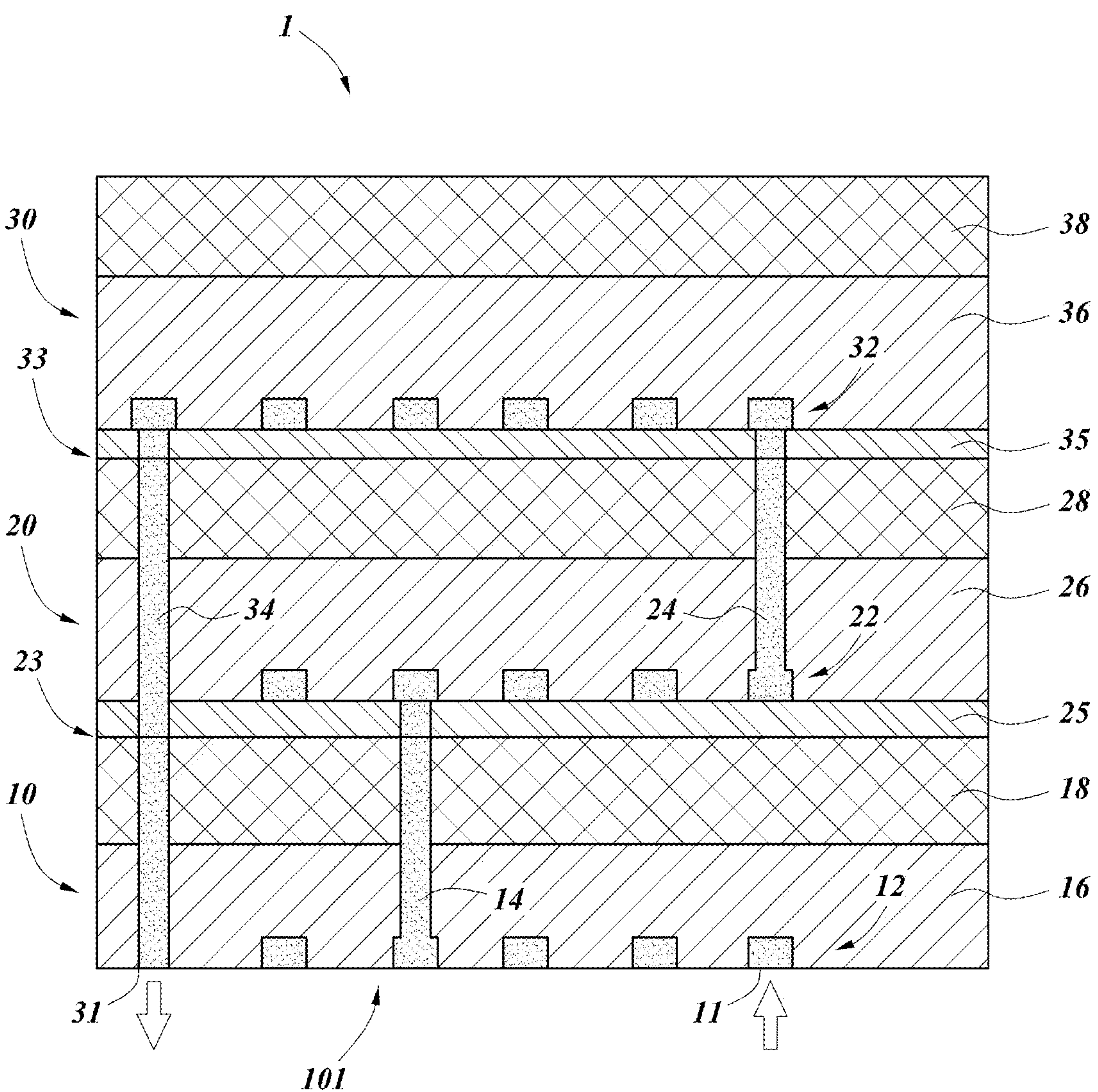
FIG. 1 is a schematic cross-sectional view of an example embodiment of an electromagnetic coil embedded in a microelectronic device comprising a plurality of stacked semiconductor elements.

Referring to the figures, FIG. 1 schematically illustrates a cross-sectional view of an example microelectronic device 1 having a plurality of (e.g., three) stacked semiconductor elements (e.g., dies/chips), including a first semiconductor element 10, a second semiconductor element 20 and a third semiconductor element 30. As shown in FIG. 1, an inductor or electromagnetic coil 101 has a first metal coil portion 12, a second metal coil portion 22 and a third metal coil portion 32 disposed respectively in a first BEOL layer 16, a second BEOL layer 26 and a third BEOL layer 36 which are disposed on respective semiconductor substrates 18, 28, 38 (also referred to herein as semiconductor substrate layers) of the first semiconductor element 10, the second semiconductor element 20 and the third semiconductor element 30. The semiconductor substrates 18, 28, 38 can comprise any suitable type of semiconductor, such as silicon, and can be patterned with devices (e.g., active circuitry) at an active side of the semiconductor element 10, 20, 30. Although various embodiments shown herein include three semiconductor elements in the stack, any suitable number of semiconductor elements (e.g., two, four, or more than four) can be provided in the stack.

In FIG. 1, the first semiconductor element 10 located at the bottom of the stack has the BEOL layer 16 disposed on the first semiconductor substrate layer 18 at the frontside, or active side, of the semiconductor element 10 with the first coil features 12 disposed in the BEOL layer 16. The second semiconductor element 20 sandwiched in the middle of the stack has the BEOL layer 26 disposed on the second semiconductor substrate layer 28 at the frontside of the semiconductor element 20 with the second coil features 22 disposed in the second BEOL layer 26. The third semiconductor element 30 located at the top of the stack can have the BEOL layer 36 disposed on the third semiconductor substrate layer 38 at the frontside of the semiconductor element 30 at the frontside with the third coil features 32 disposed in the third BEOL layer 36.

The second semiconductor element 20 further comprises a bonding layer 25 at the frontside of the element and disposed on the second BEOL layer 26. In various embodiments, the bonding layer 25 can be part of the second BEOL layer 26, e.g., an outermost layer of the BEOL layer 26. The bonding layer 25 can be directly bonded to the first substrate layer 18 of the first semiconductor element 10, forming a bonding interface 23. The bonding layer 25 may have conductive contact features and nonconductive field regions surrounding the conductive contact features. Each nonconductive field region of the bonding layer 25 may be directly bonded to a nonconductive region of the substrate 18, either to a semiconductor material of the substrate or to a nonconductive bonding layer (not shown) on the substrate. The conductive contact features can be directly bonded to corresponding conductive features of the substrate 18.

Likewise, the third semiconductor element 30 further comprises a bonding layer 35 at the frontside of the third element 30 and disposed on the third BEOL layer 36. The bonding layer 35 can be directly bonded to the second semiconductor substrate 28 of the second semiconductor element 20, forming a bonding interface 33. The bonding layer 35 may have conductive contact features and nonconductive field regions surrounding the conductive contact features, and each nonconductive field region of the bonding layer 35 may be directly bonded to a nonconductive region of the substrate 28, either to semiconductor material of the substrate or to a nonconductive bonding layer (not shown) on the substrate. The conductive contact features can be directly bonded to corresponding conductive features of the substrate 28. Although FIG. 1 does not explicitly show any metallization layer at the backside of each of the semiconductor elements 10, 20, 30, it is understood that while multiple-layer BEOL metallization is formed on the frontside, or active side, of each element, one or more layers of metallization may also be formed on the backside of the element. In addition, a bonding layer may be formed on top of the metallization layer(s) at the backside, or the top metallization layer of the backside may be a bonding layer with dielectric materials surrounding metal contact features prepared to directly bond to the bonding layer of the semiconductor element disposed immediately above. Moreover, while the active sides of the elements are shown face-down in FIG. 1, it should be appreciated that the semiconductor elements can be oriented in any suitable manner, such that the active sides of any of the semiconductor elements can face up or face down.

As shown in FIG. 1, the first coil portion 12 of the electromagnetic coil 101, which has a plurality of metal lines shown in the cross-sectional view, and the second coil portion 22 of the electromagnetic coil 101, which also has a plurality of metal lines shown in the cross-sectional view, may be spaced apart by about the thickness of the first semiconductor element 10. For example, the first coil portion 12 and the second coil portion 22 can be spaced apart by the thickness of the first semiconductor element 10 plus the thickness of the bonding layer 25 of the second semiconductor element 20. In some embodiments, the thickness of the bonding layer 25 can be substantially smaller than the thickness of the first substrate 18. A conductive via 14 extending through the first semiconductor element 10, which may be formed as a through substrate via (TSV), connects the first coil portion 12 to the second coil portion 22 of the electromagnetic coil 101. The electrical connection between the conductive via 14 and the second coil portion 22 can be made by the first semiconductor element 10 being directly bonded to the second semiconductor 20 along the bonding interface 23.

Similarly, the second coil portion 22 and the third coil portion 32 may be spaced apart by approximately the thickness of the second semiconductor element 20. A conductive via 24 extending through the second semiconductor 20, which may be formed as a through substrate via (TSV), connects the second coil portion 22 to the third coil portion 32 of the electromagnetic coil 101. The electrical connection between the conductive via 24 and the third coil portion 32 can be made when the second semiconductor element 20 is directly bonded to the third semiconductor 30 along the bonding interface 33. A conductive via 34 can extend through the second semiconductor element 20 and the first semiconductor element 10 to the lower surface of the semiconductor element 10. The conductive via 34 can be formed in each of the semiconductor elements 10 and 20 as through substrate via (TSV) and connected together upon direct bonding. In other embodiments, however, the conductive via 34 can be formed by a via last process, e.g., formed after the three semiconductor elements of the microelectronic device 1 are directly bonded. A metal contact pad 31 can be provided at a lower end of the via 34. As shown, the coil portion 12, the coil portion 22 and the coil portion 32 can be connected in series to form an inductor or electromagnetic coil embedded in the microelectronic device 1. As depicted in FIG. 1, electrical current can be input to the device 1 by way of contact pad 11. Current can pass through the first coil portion 12, the conductive via 14, the second coil portion 22, the conductive via 24, the third coil portion 32, and the conductive via 34. The current can be output from the device 1 by the contact pad 31.

As the coil portions of the electromagnetic coil 101 are spread across multiple BEOL layers and are spaced apart by the semiconductor elements, the coupling capacitance between coil portions can be greatly reduced, and the electromagnetic coil performance, or Q value, can be substantially enhanced. In some embodiments, a ground plane, e.g., an electrically conductive surface configured to be connected to electrical ground, can be disposed between the first coil portion 12 and the second coil portion 22 of the electromagnetic coil 101. For example, a metallization layer disposed between the first coil portion 12 and the second coil portion 22 of the electromagnetic coil 101 may be used as a ground plane. The ground plane may capacitively decouple the first coil portion 12 and the second coil portion 22 of the electromagnetic coil 101 and further enhance the electromagnetic coil performance. Similarly, a ground plane may be disposed between the second coil portion 22 and the third coil portion 32 and perform the same function.

Forming an electromagnetic coil in the outermost metallization layer or in the front few layers of the BEOL stack can allow the electromagnetic coil to have a lower electrical resistance, since successively thicker metal lines may be used in successively outer layers in a BEOL layer. Therefore, it is advantageous that in FIG. 1 the first coil portion 12 is located in an outer (e.g., an outermost) metallization layer of the first BEOL layer 16, and the second coil portion 22 and the third coil portion 32 are located at the layers immediately under the respective bonding layers 25 and 35 respectively. In other embodiments, the coil portions 22, 32 may be disposed in the respective bonding layers 25, 35 (e.g., outermost metallization layers of the BEOL structure). In some embodiments, the active side of the first BEOL layer 16 of the first semiconductor element 10 can be directly bonded to an external substrate, e.g., a wafer, a die, or an integrated device.

Figure 2:
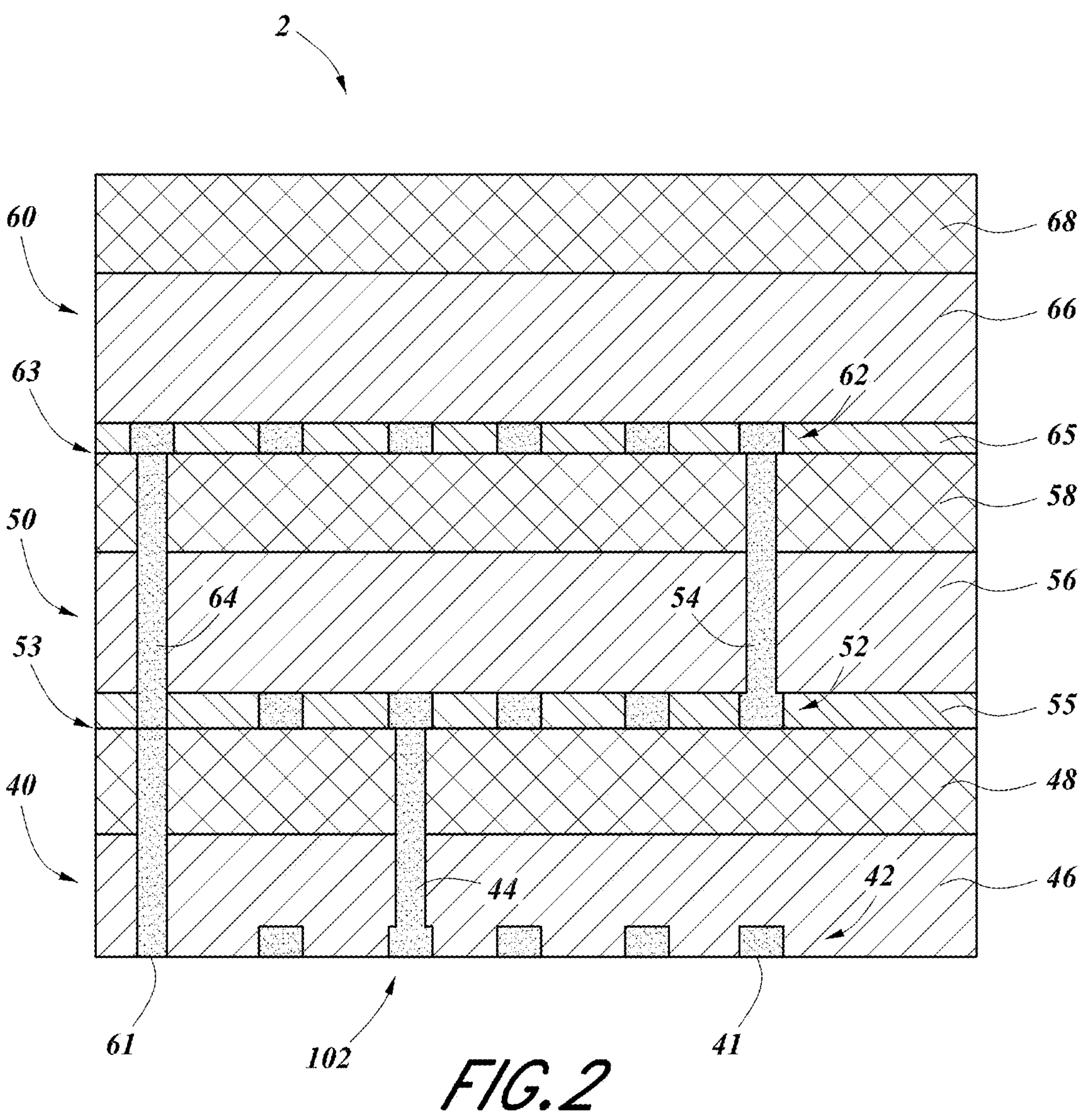
FIG. 2 is a schematic cross-sectional view of another example embodiment of an electromagnetic coil embedded in a microelectronic device comprising a plurality of stacked semiconductor elements.

An alternative embodiment of the microelectronic device 1 shown in FIG. 1 is illustrated in FIG. 2, where a schematic cross-sectional view of an example embodiment microelectronic device 2 is presented. Similar to the semiconductor elements illustrated in FIG. 1, in FIG. 2 a plurality of semiconductor elements, e.g., a first semiconductor element 40, a second semiconductor element 50 and a third semiconductor element 60, are illustrated stacked together. The first semiconductor element 40 comprises, from the frontside to the backside, a first BEOL layer 46 connected to a first semiconductor substrate layer 48. The second semiconductor element 50 comprises, from the frontside to the backside, a bonding layer 55, a second BEOL layer 56 and a second semiconductor substrate layer 58. The third semiconductor element 60 can comprises, from the frontside to the backside, a bonding layer 65, a third BEOL layer 66 and a third semiconductor substrate layer 68.

The microelectronic device 2 also comprises an inductor or electromagnetic coil 102 having a first metal coil portion 42 disposed in the first semiconductor element 40, a second metal coil portion 52 disposed in the second semiconductor element 50 and a third metal coil portion 62 disposed in the third semiconductor element 60, like the microelectronic device 1 in FIG. 1. One difference between the microelectronic device 2 in FIG. 2 and the microelectronic device 1 in FIG. 1 is that the second coil portion 52 and the third coil portion 62 are disposed within the outermost bonding layers 55 and 65 respectively, instead of the respective lower BEOL layers 56 and 66.

As discussed above, being in the outermost layer (or in an outer layer) has the advantage of wider and thicker metal feature dimensions and thus lower electrical resistance and lower self-coupling capacitance. Similar to the electromagnetic coil 101 in FIG. 1, the first coil portion 42 and the second coil portion 52 of the electromagnetic coil 102 can be spaced apart by about the thickness of the first semiconductor element 40, and are connected by a conductive via 44, which may be formed as a through substrate via (TSV). Further the second coil portion 52 and the third coil portion 62 can be spaced apart by about the thickness of the second semiconductor element 50, and can be connected by a conductive via 54, which may be formed as a TSV. A third conductive via 64 can extend through the second semiconductor element 50 and the first semiconductor element 40 to the lower surface of the semiconductor element 40. The conductive via 64 can be formed in each of the semiconductor elements 40 and 50 as TSVs and connected together upon direct bonding. Alternatively, the conductive via 64 can be formed by a via last process, e.g., formed after the three semiconductor elements of the microelectronic device 2 are directly bonded.

As shown in FIG. 2, the coil portion 42, the coil portion 52 and the coil portion 62 can be connected in series to form an inductor or electromagnetic coil 102 embedded in the microelectronic device 2. Electrical current can be input at a conductive contact pad 41 flowing to the first coil portion 42, through the conductive via 44, to the second coil portion 52, then the conductive via 54, the third coil portion 62, the conductive via 64, and finally output at a contact pad 61. The metallization bonding layer 55 of the second semiconductor element 50 can be directly bonded to the first semiconductor substrate layer 48 of the first semiconductor element 40 forming a bonding interface 53. The first substrate 48 of the first semiconductor element 40 may have a bonding layer on top with conductive contact pads and surrounding dielectric material, which are directly bonded to the contact pads of the second coil portion 52 and surrounding dielectric material disposed in the metallization bonding layer 55 of the second semiconductor element 50, respectively. Likewise, the bonding layer 65 of the third semiconductor element 60 is preferably directly bonded to the second semiconductor substrate layer 58 of the second semiconductor element 50, forming a bonding interface 63. And the second substrate 58 of the second semiconductor element 50 may have a metallization bonding layer on top with conductive contact pads and surrounding dielectric material, which are directly bonded to the contact pads of the third coil portion 62 and surrounding dielectric material disposed in the metallization bonding layer 55 of the third semiconductor element 60, respectively. Since the adjacent coil portions of the electromagnetic coil 102 are spaced apart by at least a thickness of a semiconductor element, the coupling capacitance between coil portions can be greatly reduced, and the inductor performance can be substantially enhanced.

Figure 3:
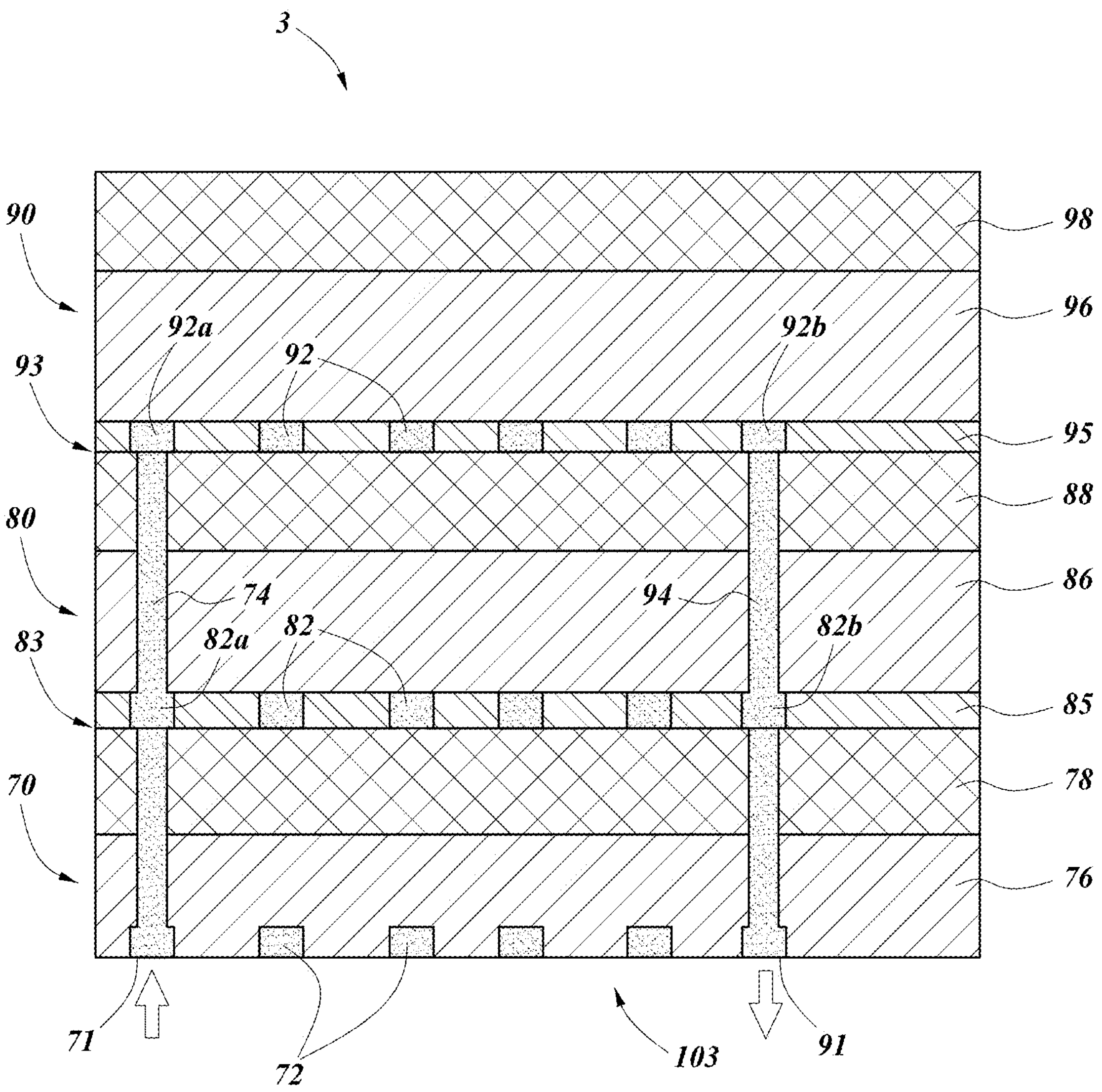
FIG. 3 is a schematic cross-sectional view of another example embodiment of an electromagnetic coil embedded in a microelectronic device comprising a plurality of stacked semiconductor elements.

FIG. 3 shows another alternative embodiment of the microelectronic device 1 in FIG. 2, where an example embodiment microelectronic device 3 comprising a plurality of stacked semiconductor elements (e.g., dies/chips), e.g., a first semiconductor element 70, a second semiconductor element 80 and a third semiconductor element 90. The first semiconductor element 70 comprises, from the frontside to the backside, a first BEOL layer 76 and a first substrate layer 78. The second semiconductor element 80 comprises, from the frontside to the backside, a metallized bonding layer 85, a second BEOL layer 86 and a second substrate layer 88. The third semiconductor element 90 comprises, from the frontside to the backside, a metallized bonding layer 95, a third BEOL layer 96 and a third substrate layer 98. The microelectronic device 3 also comprises an inductor or electromagnetic coil 103 having a first metal coil portion 72 disposed in the first semiconductor element 70, a second metal coil portion 82 disposed in the second semiconductor element 80 and a third metal coil portion 92 disposed in the third semiconductor element 90.

Similar to the microelectronic device 2 in FIG. 2, the microelectronic device 3 in FIG. 3 has all three coil portions 72, 82 and 92 of the electromagnetic coil 103 disposed within the outermost metallization layers. It should be appreciated that, as described above, the bonding layers 85, 95 may be part of (e.g., outermost layers of) the BEOL layers 86, 96. In the illustrated embodiment, the second coil portion 82 and the third coil portion 92 can be embedded in the bonding layers 85 and 95, respectively. As discussed previously, providing the coil portions 72, 82 and 92 in the outermost layers can advantageously utilize wider and thicker metal feature dimensions and thus lower electrical resistance and lower self-coupling capacitance. The first coil portion 72 and the second coil portion 82 of the electromagnetic coil 103 can be spaced apart by approximately the thickness of the first semiconductor element 70. The second coil portion 82 and the third coil portion 92 can be spaced apart by approximately the thickness of the second semiconductor element 80. Further, two conductive vias 74 and 94 can extend through the first semiconductor element 70 and the second semiconductor element 80 to connect the three coil portions 72, 82 and 92 to the lower surface of the semiconductor element 70. The two conductive vias 74 and 94 can be formed in the semiconductor elements 70 and 80 first as through substrate vias (TSVs) and then joined upon direct bonding of the three semiconductors. Alternatively, the vias can be formed as via last TSVs, as described before.

As shown in FIG. 3, the three coil portions 72, 82, and 92 can be connected in parallel. As indicated in FIG. 3, electrical current can enter the device by way of a contact pad 71, and pass through the three coil portions 72, 82 and 92 in parallel. The via 74 can provide a parallel electrical connection among the first, second, and third coil portions 72, 82, 92. Then current can pass along the conductive via 94, and leave the device 3 by way of a contact pad 91. The bonding layer 85 of the second semiconductor element 80 can be directly bonded to the first substrate layer 78 of the first semiconductor element 70 which may have a bonding layer disposed thereon. Likewise, the metallization bonding layer 95 of the third semiconductor element 90 can be directly bonded to the second substrate layer 98 of the second semiconductor element 90 which may have a bonding layer disposed thereon. The direct bonding of the three semiconductor elements 70, 80 and 90 forms two bonding interfaces 83 and 93, each between two adjacent elements. If the vias 74 and 94 are through substrate vias (TSVs), upon direct bonding the vias 74 and 94 are respectively bonded to the contact pads 82*a* and 82*b* of the second coil portion 82 at the bonding interface 83 and to the contact pads 92*a* and 92*b* of the third coil portion 92 at the bonding interface 93. If the vias 74 and 94 are via last TSVs, the connection to the three coil portions can be formed during the via last process. Since the adjacent coil portions of the electromagnetic coil 103 are spaced apart by at least a thickness of a semiconductor element, the coupling capacitance between coil portions can be greatly reduced, and the inductor performance can be substantially enhanced.

In various embodiments, a coil portion may be in a layer at or close to the surface of either the semiconductor element above it or the semiconductor element below it. For example, in FIG. 1 the second coil portion 22 of the electromagnetic coil 101, which is between the first and the second semiconductor elements 10 and 20, may be disposed within the second BEOL layer 22 of the second semiconductor element 20. Or the second coil portion 22 may be disposed within a metallization layer of the first semiconductor element 10 where the metallization layer is on the top side of the first semiconductor element 10 that faces the second semiconductor element 20. In either arrangement, the first coil portion 12 and the second coil portion 22 of the electromagnetic coil 101 can be spaced apart by at least the substrate layer 18 of the first semiconductor element 10. Similarly, the second coil portion 22 and the third coil portion 32 of the electromagnetic coil 101 can be spaced apart by at least the substrate layer 28 of the first semiconductor element 20.

In some embodiments, the stacked semiconductor elements can be directly bonded to each other without an intervening adhesive. In some embodiments, a BEOL layer associated with a semiconductor element may be deposited on the semiconductor element. In some embodiments, a bonding layer of a BEOL layer of a semiconductor element (e.g., the uppermost or lowermost layer) can be directly bonded to an adjacent (e.g., underlying or overlying) semiconductor element. For example, the bonding layer 25 of the second semiconductor element 20 in FIG. 1 can be directly bonded to the first semiconductor element 10, e.g., a bonding layer of the first semiconductor element. In some embodiments, a conductive via extending through a semiconductor element can be directly bonded to a coil portion disposed in another semiconductor element. For example, in FIG. 3 the conductive via 74 and the coil portion 82 of the electromagnetic coil 102 disposed in the bonding layer 85 of the semiconductor element 80 may be directly bonded without an adhesive. In other embodiments, a conductive via, e.g., 74, extending through a semiconductor element, e.g., 70, and electrically connected to the one or more metallization layers at the back of the semiconductor element, e.g., 70, can be directly bonded to a coil portion, e.g., 82, of the electromagnetic coil disposed in another semiconductor element, e.g., 80. In further embodiments, a coil portion of an electromagnetic coil on the back side of a first semiconductor element is connected to a coil portion on the front side of a second semiconductor element. In some examples, bonding is done using just one contact pad, e.g., 92*a*, and one coil portion, e.g., 82, is formed in a metallization layer of a first element, e.g., 80, and another coil portion, e.g., 92, is formed a metallization layer of a second element, e.g., 90. In other examples, several contact pads can be used to bond several metal coil portions of an electromagnetic coil, for example, forming one thick homogenous coil by bonding together two coils in two elements.

In some embodiments, a bonding layer, e.g., a nonconductive bonding layer, may be used to bond the BEOL layer of a semiconductor element to a substrate, e.g., another semiconductor element, a carrier or package substrate to which the die stack is mounted.

In some embodiments, a bonding layer is configured for room temperature, atmospheric pressure direct bonding, such as the ZIBOND® and DBI® processes commercially available from Adeia of San Jose, CA. In other embodiments, a bonding layer is configured for low-temperature die-to-wafer or die-to-die hybrid bonding technologies, such as the DBI® Ultra process commercially available from Adeia of San Jose, CA. In other embodiments, a bonding layer is configured for adhesive bonding.

Figure 4:
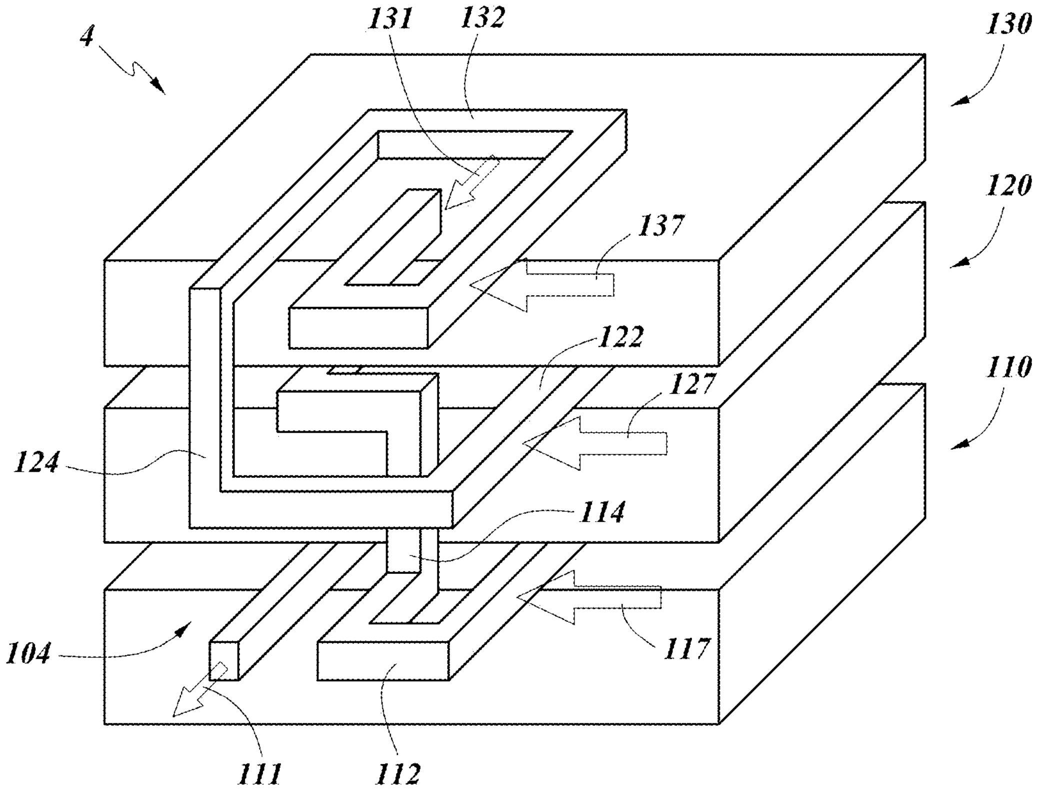
FIG. 4 is a schematic perspective view of an autotransformer embedded in a microelectronic device comprising the plurality of stacked semiconductor elements depicted in FIG. 1, with part of the structures surrounding the autotransformer coil removed for ease of illustration.

FIG. 4 is a perspective schematic view illustrating an example embodiment microelectronic device 4 with surrounding structures partially removed to expose part of the metal lines. Similar to the microelectronic device 1 in FIG. 1, the microelectronic device 4 in FIG. 4 comprises a first semiconductor element 110, a second semiconductor element 120 and a third semiconductor element 130. The microelectronic device 4 also comprises an electromagnetic coil 104 having a first metal coil portion 112, a second metal coil portion 122 and a third metal coil portion 132 each disposed in a corresponding BEOL layer (e.g., an outermost bonding layer or a buried layer of the BEOL stack) of the first semiconductor element 110, the second semiconductor element 120 and the third semiconductor element 130, respectively. The first coil portion 112 and the second coil portion 122 can be spaced apart by at least the substrate layer of the second semiconductor element 120. The second coil portion 122 and the third coil portion 132 can be spaced apart by at least the substrate layer of the third semiconductor element 130. As such the coupling capacitance between the coil portions can be greatly reduced, and the performance of the electromagnetic coil can be substantially enhanced. Comparing to the semiconductor elements in the devices 1 in FIG. 1, the semiconductor elements in the electromagnetic device 4 in FIG. 4 may have their active sides facing upward. Further, a first conductive via (e.g., a TSV) 114 connecting the first coil portion 112 to the second coil portion 122 and a second conductive via (e.g., a TSV) 124 connecting the second coil portion 122 to the third coil portion 132 can be located at different vertical planes. In addition, FIG. 4 further illustrates that the electromagnetic coil 104 can have a rectangular spiral winding structure disposed in BEOL or bonding layers.

FIG. 4 illustrates that the electromagnetic coils 101 described in connection with FIG. 1 may be used to form an autotransformer. In FIG. 4, a plurality of (e.g., three) tapping points (access points) on the electromagnetic coil 104 are provided, e.g., a first tapping point 117, a second tapping point 127 and a third tapping point 137. As shown in FIG. 4, electrical current can flow in the direction from an input 131 located at the end of the third coil portion 132 to an output 111 at the end of the first coil portion 112. When an input voltage $V_0$ is supplied across the input 131 and the output 111 and the output voltage is tapped at the first tapping point 117, the second tapping point 127 or the third tapping point 137, a different output voltage can be obtained across the tapping point and the output 111. For example, if the first tapping point 117 is accessed for output, because the point is located on the first coil portion 112 and close to the conductive via 114, the output voltage may be close to but less than ⅓ of the input voltage $V_0$. If the second tapping point 127 is accessed for output, because the point is located on the second coil portion 122 and close to the second conductive via 124, the output voltage may be close to but less than ⅔ of the input voltage $V_0$. In this manner, an autotransformer can be established to produce different voltages.

Figure 5:
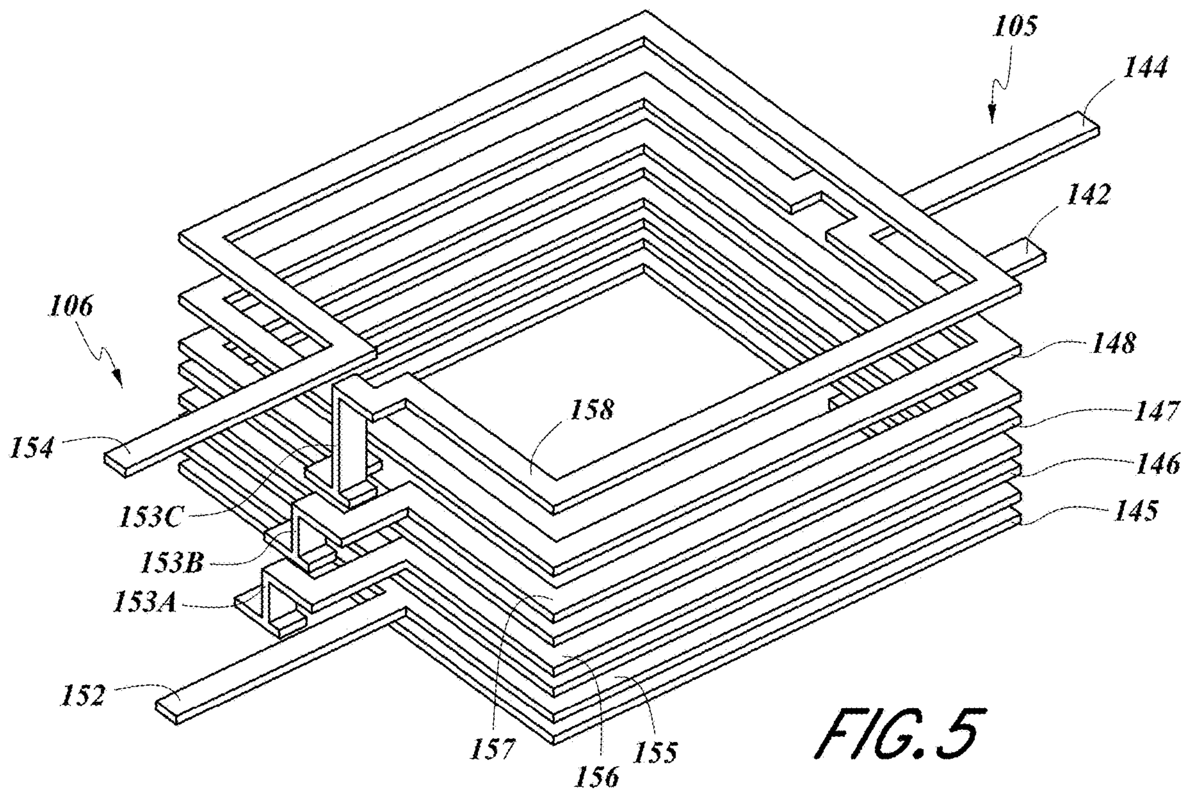
FIG. 5 is a schematic perspective view of a transformer made of a primary electromagnetic coil and a secondary electromagnetic coil embedded in a microelectronic device comprising multiple stacked semiconductor elements.

FIG. 5 schematically illustrates a transformer including a plurality of (e.g., two) electromagnetic coils stacked together, with surrounding structures removed for ease of illustration. The transformer includes a primary electromagnetic coil 106 and a secondary electromagnetic coil 105. As shown in FIG. 5, coil portions of the primary electromagnetic coil 106 can be inter-stacked with coil portions of the secondary electromagnetic coil 105. For example, the first coil portion 155 of the primary electromagnetic coil 106 is inter-stacked between the first coil portion 145 and the second coil portion 146 of the secondary electromagnetic coil 105. The second coil portion 156 of the primary electromagnetic coil 106 is inter-stacked between the second coil portion 146 and the third coil portion 147 of the secondary electromagnetic coil 105. The third coil portion 157 of the primary electromagnetic coil 106 is inter-stacked between the third coil portion 147 and the fourth coil portion 148 of the secondary electromagnetic coil 105.

The perspective schematic view in FIG. 5 also depicts the conductive vias connecting the metal coil layers of the primary electromagnetic coil 106. For example, the first conductive via 153A connects the first coil portion 155 and the second coil portion 156 of the primary electromagnetic coil 106. The second conductive via 153B connects the second coil portion 156 and the third coil portion 157 of the primary electromagnetic coil 106. And the third conductive via 153C connects the third coil portion 157 and the fourth coil portion 158 of the primary electromagnetic coil 106. The conductive vias connecting the metal coil layers of the secondary electromagnetic coil 105 are not visible at the angle of the perspective view. According to the schematic perspective view shown in FIG. 5, when a voltage is applied to the primary electromagnetic coil 106 across an input 154 and an output 152, the secondary electromagnetic coil 105 delivers an electrical current across and an input 144 and an output 142 with a voltage determined by the coil turn ratio between the two related electromagnetic coils 105 and 106.

Figure 6:
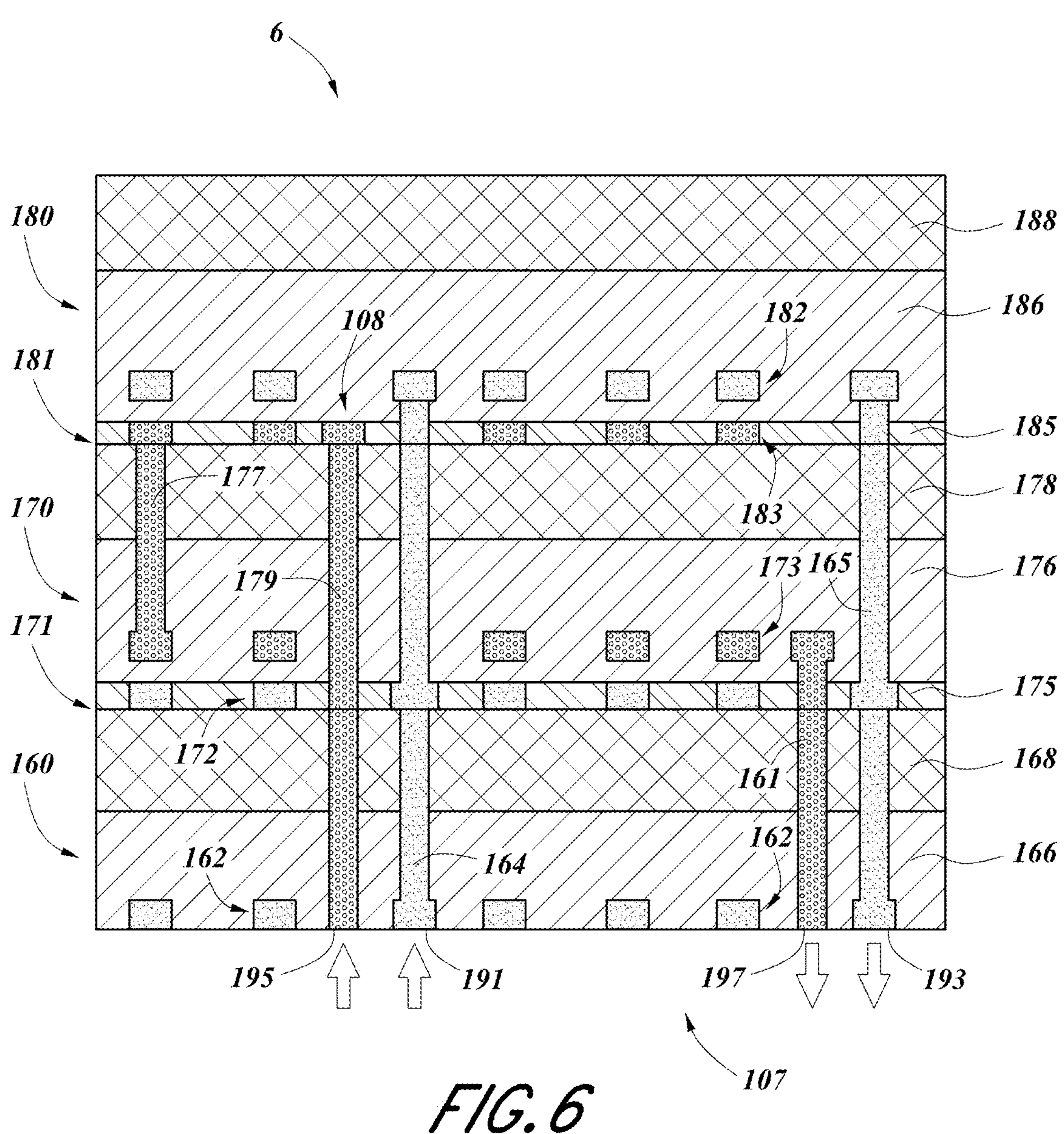
FIG. 6 is a schematic cross-sectional view of an example embodiment of two electromagnetic coils, with one coil in series arrangement and the other in parallel arrangement, embedded in a microelectronic device comprising three stacked semiconductor elements.

FIG. 6 schematically illustrates a cross-sectional view of an example microelectronic device 6 having a plurality of (e.g., three) stacked semiconductor elements (e.g., dies/chips), e.g., the first semiconductor element 160, the second semiconductor element 170 and the third semiconductor element 180. The microelectronic device 6 in FIG. 6 also comprises a plurality of (e.g., two) electromagnetic coils, e.g., a first electromagnetic coil 107 and a second electromagnetic coil 108, which are disposed inter-stacked. In one example, each of the two electromagnetic coils has coil portions disposed in multiple BEOL layers or bonding layers of the stacked semiconductor elements. Adjacent coil portions of each electromagnetic coil can be spaced apart by the substrate of a semiconductor element. Conductive vias extending through the semiconductor elements may connect different coil portions of an electromagnetic coil.

In FIG. 6, for the first electromagnetic coil 107, a first coil portion 162 is disposed in a first BEOL layer 166 of the first semiconductor element 160, a second coil portion 172 is disposed in a bonding layer 175 of the second semiconductor element 170, and a third coil portion 182 is disposed in a third BEOL layer 186 of the third semiconductor element 180. A plurality of conductive vias 164 and 165 can extend through the first semiconductor element 160 and the second semiconductor 170 to connect the coil portions 162, 172 and 182 of the first electromagnetic coil 107, making the three coil portions connected in parallel. The conductive vias 164 and 165 can be individual TSVs formed in the semiconductor elements 160 and 170, and bonded together at the bonding interface 171 and to the contact pads of the third coil portion 182 of the first electromagnetic coil 107 at the bonding interface 181 when direct bonding is performed. Or they can be formed last TSVs formed after the three semiconductor elements 160, 170 and 180 of the microelectronic device 6 are directed bonded.

Further, for the second electromagnetic coil 108, a first coil portion 173 is disposed in a second BEOL layer 176 of the second semiconductor element 170, and a second coil portion 183 is disposed in a bonding layer 185 of the third semiconductor element 180. A conductive via 161 extends from the lower surface of the first semiconductor element 160 and through the semiconductor element to connect the first coil portion 173. A second conductive via 177 extends through the second semiconductor element 170 to connect the first coil portion 173 to the second coil portion 183 of the second electromagnetic coil 108. A third conductive via 179 extends through the second semiconductor element 170 and the first semiconductor element 160 to connect the second coil portion 183 to the lower surface of the first semiconductor element 160. Again, the conductive vias 161, 177 and 179 can be formed in semiconductor elements 160 and 170 and then bonded at the bonding interfaces 171 and 181 when direct bonding is performed for the stacked elements. Or via 179, for example, can be formed by the via last process after the three semiconductor elements 160, 170 and 180 are directly bonded.

In each of the second and third semiconductor elements 170 and 180, the metallization layers with the coil portion 172 and 182 for the first electromagnetic coil 107 and the metallization layers with the coil portion 173 and 183 for the second electromagnetic coil 108 can respectively be spaced by at least another layer made of dielectric material(s) or another metallization layer. As current flows in the input 191, through the first electromagnetic coil 107, and exits the output 193, current may be inducted in the second electromagnetic coil 107, flowing from the input 195 to the output 197. Or the two electromagnetic coils can be operated performing their own functions.

Although in FIGS. 1, 2, 3, 4 and 6 example electromagnetic coils are illustrated to spread across three dies or semiconductor elements, it is to be understood that the disclosed electromagnetic coils may spread across two or more than three semiconductor elements in a multi-die stack. In some embodiments, two or more separate electromagnetic coils or inductors may be disposed in the same die stack, where each of the electromagnetic coils/inductors may spread across several semiconductor elements/dies in the die stack, for example.

Figure 7:
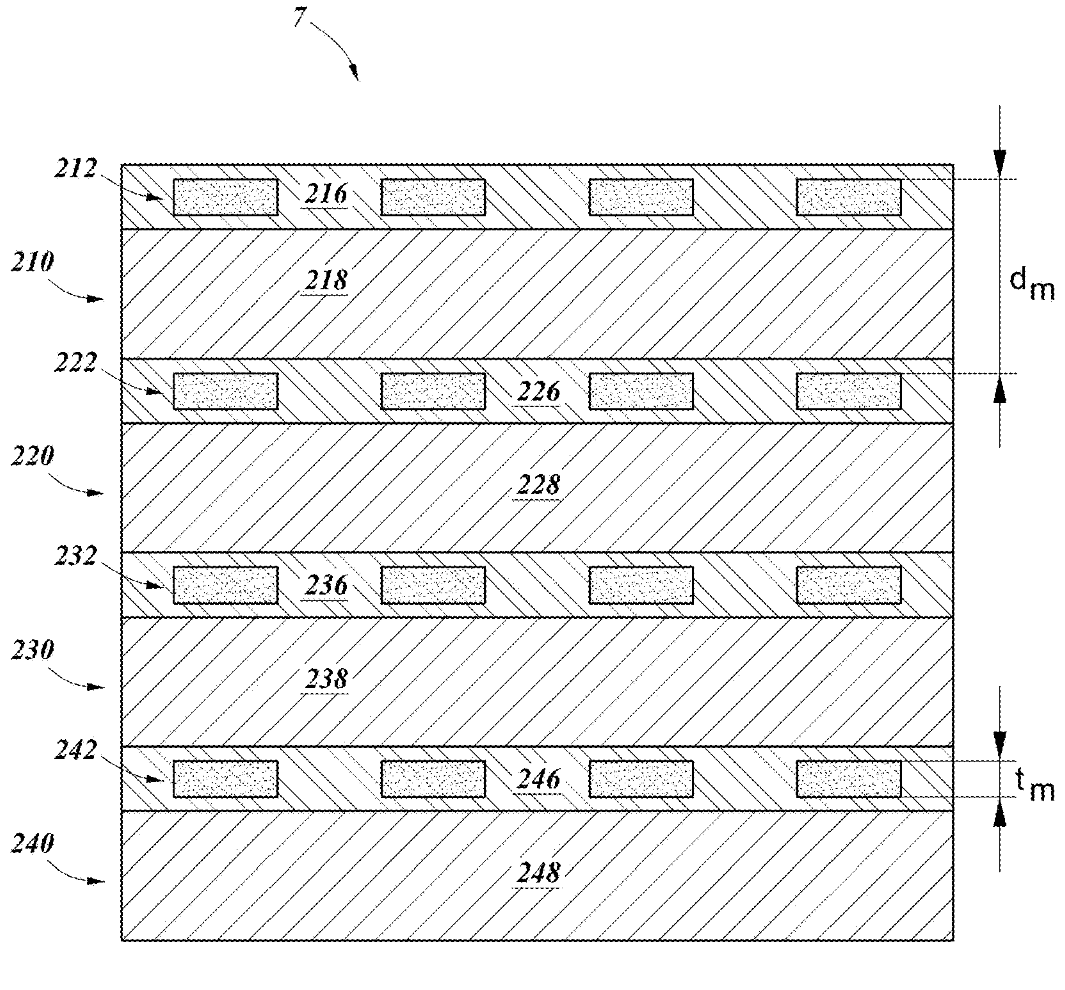
FIG. 7 is a schematic cross-sectional view of an example embodiment of an electromagnetic coil embedded in a microelectronic device comprising a plurality of (e.g., four) stacked semiconductor elements, depicting a distance between adjacent coils and a thickness of coil metal lines.
Figure 8:
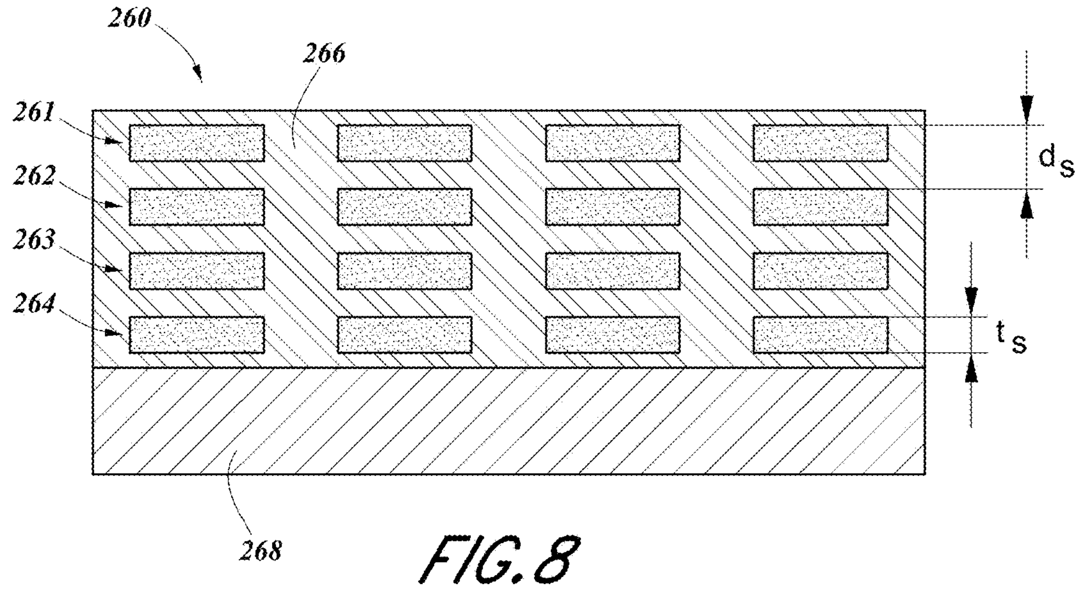
FIG. 8 is a schematic cross-sectional view of an example embodiment of an electromagnetic coil embedded in a single semiconductor element, depicting a distance between adjacent coils and a thickness of coil metal lines.

FIGS. 7 and 8 illustrates a reduction of capacitive coupling and an increase of Q value of electromagnetic coils or inductors due to the stacked and bonded semiconductor elements shown in FIGS. 1-5. FIG. 6 is a schematic cross-sectional view showing a plurality (e.g., four) semiconductor elements stacked together, including a first semiconductor element 210 having a first BEOL layer 216 and a first substrate layer 218, a second semiconductor element 220 having a second BEOL layer 226 and a second substrate layer 228, a third semiconductor element 230 having a third BEOL layer 236 and a third substrate layer 238, and a fourth semiconductor element 240 having a fourth BEOL layer 246 and a fourth substrate layer 248. The four semiconductor elements, 210, 220, 230 and 240 are directly bonded together. Each of the BEOL layers can have a coil portion of an electromagnetic coil disposed therein. Together there are four coil portions in the illustrated example embodiment, including a first coil portion 212, a second coil portion 222, a third coil portion 232, and a fourth coil portion 242. Each adjacent coil portions of the electromagnetic coil can be spaced apart by at least the respective substrates 218, 228, 238, 248 of a semiconductor element with a distance $d_m$. A thickness of the metal lines that form the coil portions is shown in FIG. 6 as $t_m$.

In comparison, FIG. 8 illustrates a plurality of (e.g., four) portions of an electromagnetic coil, including a first coil portion 261, a second coil portion 262, a third coil portion 263, and a fourth coil portion 264, disposed in a BEOL stack layer 266 of a single semiconductor element 260, which has a substrate layer 268. In FIG. 8, the distance between the adjacent coil portions is denoted as $D_s$, and the thickness of each metal coil portion layer is denoted as $t_s$. In the microelectronic device 7 in FIG. 7, the distance from one coil portion to the next coil portion, $d_m$, may be approximately the thickness of a semiconductor element. In contrast the inter coil portion distance in a single semiconductor element 260 as shown in FIG. 8, $d_s$, is on the order of a single BEOL layer separating the adjacent coil portions, the inter coil portion distance ratio between the stacked and single die/chip arrangements, $d_m/d_s$, can be in the range of 10 to 50. On the other hand, in the microelectronic device 7 of FIG. 7, each coil portion can be fabricated in one of the outer BEOL layers (including, e.g., the bonding layer(s)) which have thicker and wider metal lines. In the single semiconductor element 260 in FIG. 8, coil portions of the electromagnetic coil can be formed in many BEOL layers. Therefore, the thickness ratio $t_m/t_s$ is in general in the range of 5 to 10.

Capacitance coupling C and quality factor Q of an inductor or electromagnetic coil can be determined by the following equations:

$$C = E_0 E_r w\, l/d$$

$$Q = \frac{\mu w N t^2 w^2}{R_0 l^2}$$

where $E_0$ and $E_r$ are permittivity $R_0$ is resistivity

μ is permeability

N is number of turns of the coil l is length of wire on one layer w is the width inductor wire d is spacing between adjacent coils For comparison between an electromagnetic coil disposed in a microelectronic device with multi-stacked semiconductor elements as described in the disclosed embodiments and an electromagnetic coil disposed in a single semiconductor element, the ratio of capacitance coupling C and quality factor Q of the two electromagnetic coils is expressed in the questions above. With rearrangement and factor eliminations the Q-ratio and C-ratio can be given as:

$$Q-\text{ratio} = \frac{Q_m}{Q_s} = \left(\frac{t_m}{t_s}\right)^2$$

$$C-\text{ratio} = \frac{C_m}{C_s} = \frac{d_s}{d_m}$$

By applying the data range expressed above for $d_m/d_s$ and $t_m/t_s$, Q-ratio and C-ratio can be calculated. Therefore, the Q value of an electromagnetic coil embedded in a microelectronic device having multi-stacked semiconductor elements as disclosed herein can be about 25 to 100 times higher than that of an electromagnetic coil formed in a single semiconductor element. And for C factor comparison, the same electromagnetic coil in the multi-stacked semiconductor elements as disclosed herein can be about 0.02-0.1 of that of an electromagnetic coil formed in a single semiconductor element.

Electronic Elements

A die can refer to any suitable type of integrated device die. For example, the integrated device dies can comprise an electronic component such as an integrated circuit (such as a processor die, a controller die, or a memory die), a microelectromechanical systems (MEMS) die, an optical device, or any other suitable type of device die. In some embodiments, the electronic component can comprise a passive device such as a capacitor, inductor, or other surface-mounted device. Circuitry (such as active components like transistors) can be patterned at or near active surface(s) of the die in various embodiments. The active surface may be on a side of the die which is opposite the backside of the die. The backside may or may not include any active circuitry or passive devices.

An integrated device die can comprise a bonding surface and a back surface opposite the bonding surface. The bonding surface can have a plurality of conductive bond pads including a conductive bond pad, and a non-conductive material proximate to the conductive bond pad. In some embodiments, the conductive bond pads of the integrated device die can be directly bonded to the corresponding conductive pads of the substrate or wafer without an intervening adhesive, and the non-conductive material of the integrated device die can be directly bonded to a portion of the corresponding non-conductive material of the substrate or wafer without an intervening adhesive. Directly bonding without an adhesive is described throughout U.S. Pat. Nos. 7,126,212; 8,153,505; 7,622,324; 7,602,070; 8,163,373; 8,389,378; 7,485,968; 8,735,219; 9,385,024; 9,391,143; 9,431,368; 9,953,941; 9,716,033; 9,852,988; 10,032,068; 10,204,893; 10,434,749; and 10,446,532, the contents of each of which are hereby incorporated by reference herein in their entirety and for all purposes.

Examples of Direct Bonding Methods and Directly Bonded Structures

Various embodiments disclosed herein relate to directly bonded structures in which two elements can be directly bonded to one another without an intervening adhesive. Two or more electronic elements, which can be semiconductor elements (such as integrated device dies, wafers, etc.), may be stacked on or bonded to one another to form a bonded structure. Conductive contact pads of one element may be electrically connected to corresponding conductive contact pads of another element. Any suitable number of elements can be stacked in the bonded structure. The contact pads may comprise metallic pads formed in a nonconductive bonding region, and may be connected to underlying metallization, such as a redistribution layer (RDL).

In some embodiments, the elements are directly bonded to one another without an adhesive. In various embodiments, a non-conductive or dielectric material of a first element can be directly bonded to a corresponding non-conductive or dielectric field region of a second element without an adhesive. The non-conductive material can be referred to as a nonconductive bonding region or bonding layer of the first element. In some embodiments, the non-conductive material of the first element can be directly bonded to the corresponding non-conductive material of the second element using dielectric-to-dielectric bonding techniques. For example, dielectric-to-dielectric bonds may be formed without an adhesive using the direct bonding techniques disclosed at least in U.S. Pat. Nos. 9,564,414; 9,391,143; and 10,434,749, the entire contents of each of which are incorporated by reference herein in their entirety and for all purposes. Suitable dielectric materials for direct bonding include but are not limited to inorganic dielectrics, such as silicon oxide, silicon nitride, or silicon oxynitride, or can include carbon, such as silicon carbide, silicon oxycarbonitride, silicon carbonitride or diamond-like carbon. In some embodiments, the dielectric materials do not comprise polymer materials, such as epoxy, resin or molding materials.

In various embodiments, hybrid direct bonds can be formed without an intervening adhesive. For example, dielectric bonding surfaces can be polished to a high degree of smoothness. The bonding surfaces can be cleaned and exposed to a plasma and/or etchants to activate the surfaces. In some embodiments, the surfaces can be terminated with a species after activation or during activation (e.g., during the plasma and/or etch processes). Without being limited by theory, in some embodiments, the activation process can be performed to break chemical bonds at the bonding surface, and the termination process can provide additional chemical species at the bonding surface that improves the bonding energy during direct bonding. In some embodiments, the activation and termination are provided in the same step, e.g., a plasma or wet etchant to activate and terminate the surfaces. In other embodiments, the bonding surface can be terminated in a separate treatment to provide the additional species for direct bonding. In various embodiments, the terminating species can comprise nitrogen. Further, in some embodiments, the bonding surfaces can be exposed to fluorine. For example, there may be one or multiple fluorine peaks near layer and/or bonding interfaces. Thus, in the directly bonded structures, the bonding interface between two dielectric materials can comprise a very smooth interface with higher nitrogen content and/or fluorine peaks at the bonding interface. Additional examples of activation and/or termination treatments may be found throughout U.S. Pat. Nos. 9,564,414; 9,391,143; and 10,434,749, the entire contents of each of which are incorporated by reference herein in their entirety and for all purposes.

In various embodiments, conductive contact pads of the first element can also be directly bonded to corresponding conductive contact pads of the second element. For example, a hybrid bonding technique can be used to provide conductor-to-conductor direct bonds along a bond interface that includes covalently direct bonded dielectric-to-dielectric surfaces, prepared as described above. In various embodiments, the conductor-to-conductor (e.g., contact pad to contact pad) direct bonds and the dielectric-to-dielectric hybrid bonds can be formed using the direct bonding techniques disclosed at least in U.S. Pat. Nos. 9,716,033 and 9,852,988, the entire contents of each of which are incorporated by reference herein in their entirety and for all purposes.

For example, dielectric bonding surfaces can be prepared and directly bonded to one another without an intervening adhesive as explained above. Conductive contact pads (which may be surrounded by nonconductive dielectric field regions) may also directly bond to one another without an intervening adhesive. In some embodiments, the respective contact pads can be recessed below exterior (e.g., upper) surfaces of the dielectric field or nonconductive bonding regions, for example, recessed by less than 30 nm, less than 20 nm, less than 15 nm, or less than 10 nm, for example, recessed in a range of 2 nm to 20 nm, or in a range of 4 nm to 10 nm. The nonconductive bonding regions can be directly bonded to one another without an adhesive at room temperature in some embodiments in the bonding tool described herein and, subsequently, the bonded structure can be annealed. Annealing can be performed in a separate apparatus. Upon annealing, the contact pads can expand and contact one another to form a metal-to-metal direct bond. Beneficially, the use of hybrid bonding techniques, such as Direct Bond Interconnect, or DBI®, available commercially from Adeia of San Jose, CA, can enable high density of pads connected across the direct bond interface (e.g., small or fine pitches for regular arrays). In some embodiments, the pitch of the bonding pads, or conductive traces embedded in the bonding surface of one of the bonded elements, may be less 40 microns or less than 10 microns or even less than 2 microns. For some applications the ratio of the pitch of the bonding pads to one of the dimensions of the bonding pad is less than 5, or less than 3 and sometimes desirably less than 2. In other applications the width of the conductive traces embedded in the bonding surface of one of the bonded elements may range between 0.3 to 3 microns. In various embodiments, the contact pads and/or traces can comprise copper, although other metals may be suitable.

Thus, in direct bonding processes, a first element can be directly bonded to a second element without an intervening adhesive. In some arrangements, the first element can comprise a singulated element, such as a singulated integrated device die. In other arrangements, the first element can comprise a carrier or substrate (e.g., a wafer) that includes a plurality (e.g., tens, hundreds, or more) of device regions that, when singulated, form a plurality of integrated device dies. In embodiments described herein, whether a die or a substrate, the first element can be considered a host substrate and is mounted on a support in the bonding tool to receive the second element from a pick-and-place or robotic end effector. The second element of the illustrated embodiments comprises a die. In other arrangements, the second element can comprise a carrier or substrate (e.g., a wafer).

As explained herein, the first and second elements can be directly bonded to one another without an adhesive, which is different from a deposition process. In one application, a width of the first element in the bonded structure can be similar to a width of the second element. In some other embodiments, a width of the first element in the bonded structure can be different from a width of the second element. The width or area of the larger element in the bonded structure may be at least 10% larger than the width or area of the smaller element. The first and second elements can accordingly comprise non-deposited elements. Further, directly bonded structures, unlike deposited layers, can include a defect region along the bond interface in which nanovoids are present. The nanovoids may be formed due to activation of the bonding surfaces (e.g., exposure to a plasma). As explained above, the bond interface can include concentration of materials from the activation and/or last chemical treatment processes. For example, in embodiments that utilize a nitrogen plasma for activation, a nitrogen peak can be formed at the bond interface. In embodiments that utilize an oxygen plasma for activation, an oxygen peak can be formed at the bond interface. In some embodiments, the bond interface can comprise silicon oxynitride, silicon oxycarbonitride, or silicon carbonitride. As explained herein, the direct bond can comprise a covalent bond, which is stronger than van Der Waals bonds. The bonding layers can also comprise polished surfaces that are planarized to a high degree of smoothness. For example, the bonding layers may have a surface roughness of less than 2 nm root mean square (RMS), or less than 1 nm RMS.

In various embodiments, the metal-to-metal bonds between the contact pads can be joined such that copper grains grow into each other across the bond interface. In some embodiments, the copper can have grains oriented along the 111 crystal plane for improved copper diffusion across the bond interface. The bond interface can extend substantially entirely to at least a portion of the bonded contact pads, such that there is substantially no gap between the nonconductive bonding regions at or near the bonded contact pads. In some embodiments, a barrier layer may be provided under the contact pads (e.g., which may include copper). In other embodiments, however, there may be no barrier layer under the contact pads, for example, as described in US 2019/0096741, which is incorporated by reference herein in its entirety and for all purposes.

In one aspect, a microelectronic device is disclosed. The microelectronic device can include a first semiconductor element. The microelectronic device can also include a second semiconductor element disposed on the first semiconductor element. The microelectronic device can also include an electromagnetic coil. A first portion of the electromagnetic coil and a second portion of the electromagnetic coil are spaced apart by the first semiconductor element. A first conductive via extending through the first semiconductor element connects the first and second portions of the electromagnetic coil.

In one embodiment, the electromagnetic coil is configured to operate as an inductor.

In one embodiment, the electromagnetic coil is configured to operate as an autotransformer.

In one embodiment, the electromagnetic coil is configured to operate as part of a transformer.

In one embodiment, the second semiconductor element is directly bonded to the first semiconductor element without an intervening adhesive.

In one embodiment, the interface between the first and second semiconductor elements comprises conductor-to-conductor and dielectric-to-dielectric direct bonds.

In one embodiment, the first portion of the electromagnetic coil is disposed in a back end of line (BEOL) layer associated with the first semiconductor element.

In one embodiment, the first portion of the electromagnetic coil is disposed in the outermost metallization layer of a back end of line (BEOL) layer associated with the first semiconductor element.

In one embodiment, the first semiconductor element is disposed on a surface of a substrate, and wherein the first portion of the electromagnetic coil is disposed in a metallization layer on the surface of the substrate.

In one embodiment, the first portion of the electromagnetic coil is disposed in a first bonding layer which bonds an associated BEOL layer of the first semiconductor element to a substrate.

In one embodiment, the associated BEOL layer of the first semiconductor element is directly bonded to the substrate without an intervening adhesive.

In one embodiment, the first bonding layer comprises an adhesive.

In one embodiment, the first portion of the electromagnetic coil has a rectangular spiral winding.

In one embodiment, the second portion of the electromagnetic coil is disposed in a back end of line (BEOL) layer associated with the second semiconductor element.

In one embodiment, the second portion of the electromagnetic coil is disposed in the outermost metallization layer of a back end of line (BEOL) layer associated with the second semiconductor element.

In one embodiment, the second semiconductor element is disposed on a surface of the first semiconductor element, and wherein the second portion of the electromagnetic coil is disposed in a metallization layer on the surface of the the first semiconductor element.

In one embodiment, the second portion of the electromagnetic coil is disposed in a second bonding layer which bonds an associated BEOL layer of the second semiconductor element to the first semiconductor element.

In one embodiment, the associated BEOL layer of the second semiconductor element is directly bonded to the first semiconductor element without an intervening adhesive.

In one embodiment, the second bonding layer comprises an adhesive.

In one embodiment, the second portion of the electromagnetic coil has a rectangular spiral winding.

In one embodiment, the microelectronic device further includes a third semiconductor element arranged on the second semiconductor element, wherein a third portion of the electromagnetic coil is spaced apart from the second portion of the electromagnetic coil by the second semiconductor element, and wherein a second conductive via extending through the second semiconductor element connects the second and third portions of the electromagnetic coil.

In one embodiment, the first semiconductor element comprises an integrated device die.

In one embodiment, the second semiconductor element comprises an integrated device die.

In one embodiment, the electromagnetic coil comprises a metallic wire, wherein the smallest diameter of the metallic wire is at least 0.5 μm.

In one embodiment, the spacing between the first portion of the electromagnetic coil and the second portion of the electromagnetic coil is at least 5 μm.

In one embodiment, a metallization layer configured to be connected to electrical ground is disposed between the first and second portions of the electromagnetic coil.

In one embodiment, the electromagnetic coil comprises at least three access points configured for electrical connections.

In one embodiment, the electromagnetic coil is configured to operate as an autotransformer.

In one embodiment, the microelectronic device further includes an additional electromagnetic coil.

In one embodiment, the electromagnetic coil and the additional electromagnetic coil are configured to operate as a transformer.

In one embodiment, two portions of the additional electromagnetic coil are spaced apart by at least one of the semiconductor elements.

In one embodiment, a portion of the additional electromagnetic coil is disposed in a back end of line (BEOL) layer associated with one of the semiconductor elements.

In one embodiment, a portion of the additional electromagnetic coil is disposed in the outermost metallization layer of a back end of line (BEOL) layer associated with one of the semiconductor elements.

In one embodiment, a portion of the additional electromagnetic coil is disposed in a bonding layer between the semiconductor elements.

In one embodiment, a portion of the additional electromagnetic coil has a rectangular spiral winding.

In one embodiment, the additional electromagnetic coil comprises a metallic wire, wherein the smallest diameter of the metallic wire is at least 0.5 μm.

In one embodiment, the spacing between two portions of the additional electromagnetic coil is at least 5 μm.

In one aspect, a microelectronic device is disclosed. The microelectronic device can include a first semiconductor element. The microelectronic device can also include a second semiconductor element disposed on the first semiconductor element. The microelectronic device can also include a first electromagnetic coil adjacent to the first semiconductor element. The microelectronic device can also include a second electromagnetic coil adjacent to the second semiconductor element. The first electromagnetic coil and the second electromagnetic coil are spaced apart by the first semiconductor element. At least one of the first electromagnetic coil and the second electromagnetic coil is disposed in a layer configured for direct bonding.

In one embodiment, the first electromagnetic coil is disposed in a first bonding layer which directly bonds an associated BEOL layer of the first semiconductor element to a substrate.

In one embodiment, the associated BEOL layer of the first semiconductor element is directly bonded to the substrate without an intervening adhesive.

In one embodiment, the second electromagnetic coil is disposed in a second bonding layer which directly bonds an associated BEOL layer of the second semiconductor element to the first semiconductor element.

In one embodiment, the second electromagnetic coil is disposed in a back end of line (BEOL) layer associated with the second semiconductor element.

In one embodiment, the second electromagnetic coil is disposed in the outermost metallization layer of a back end of line (BEOL) layer associated with the second semiconductor element.

In one embodiment, the first electromagnetic coil has a rectangular spiral winding.

In one embodiment, the second electromagnetic coil is disposed in a bonding layer which directly bonds an associated BEOL layer of the second semiconductor element to the first semiconductor element.

In one embodiment, the associated BEOL layer of the second semiconductor element is directly bonded to the first semiconductor element without an intervening adhesive.

In one embodiment, the first electromagnetic coil is disposed in a layer which directly bonds an associated BEOL layer of the first semiconductor element to a substrate without an intervening adhesive.

In one embodiment, the first electromagnetic coil is disposed in a back end of line (BEOL) layer associated with the first semiconductor element.

In one embodiment, the first electromagnetic coil is disposed in the outermost metallization layer of a back end of line (BEOL) layer associated with the first semiconductor element.

In one embodiment, the second electromagnetic coil has a rectangular spiral winding.

In one embodiment, the first semiconductor element comprises an integrated device die.

In one embodiment, the second semiconductor element comprises an integrated device die.

In one embodiment, the first electromagnetic coil comprises a metallic wire, wherein the smallest diameter of the metallic wire is at least 0.5 μm.

In one embodiment, the second electromagnetic coil comprises a metallic wire, wherein the smallest diameter of the metallic wire is at least 0.5 μm.

In one embodiment, the spacing between the first electromagnetic coil and the second electromagnetic coil is at least 5 μm.

In one embodiment, the first electromagnetic coil and the second electromagnetic coil are configured to operate as a transformer.

In one aspect, a method of forming a microelectronic device is disclosed. The method can include providing a first semiconductor element and a first coiled structure adjacent to the first semiconductor element. A first conductive via is extending through the first semiconductor element. The method can also include providing a second semiconductor element and a second coiled structure adjacent to the second semiconductor element. The method can also include bonding the second semiconductor element to the first semiconductor element, such that the first coiled structure and the second coiled structure are connected by the first conductive via. The first coiled structure and the second coiled structure are spaced apart by the first semiconductor element.

In one embodiment, the second semiconductor element is directly bonded to the first semiconductor element without an intervening adhesive.

Unless the context clearly requires otherwise, throughout the description and the claims, the words "comprise," "comprising," "include," "including" and the like are to be construed in an inclusive sense, as opposed to an exclusive or exhaustive sense; that is to say, in the sense of "including, but not limited to." The word "coupled", as generally used herein, refers to two or more elements that may be either directly connected, or connected by way of one or more intermediate elements. Likewise, the word "connected", as generally used herein, refers to two or more elements that may be either directly connected, or connected by way of one or more intermediate elements. Additionally, the words "herein," "above," "below," and words of similar import, when used in this application, shall refer to this application as a whole and not to any particular portions of this application. Moreover, as used herein, when a first element is described as being "on" or "over" a second element, the first element may be directly on or over the second element, such that the first and second elements directly contact, or the first element may be indirectly on or over the second element such that one or more elements intervene between the first and second elements. Where the context permits, words in the above Detailed Description using the singular or plural number may also include the plural or singular number respectively. The word "or" in reference to a list of two or more items, that word covers all of the following interpretations of the word: any of the items in the list, all of the items in the list, and any combination of the items in the list.

Moreover, conditional language used herein, such as, among others, "can," "could," "might," "may," "e.g.," "for example," "such as" and the like, unless specifically stated otherwise, or otherwise understood within the context as used, is generally intended to convey that certain embodiments include, while other embodiments do not include, certain features, elements and/or states. Thus, such conditional language is not generally intended to imply that features, elements and/or states are in any way required for one or more embodiments.

While certain embodiments have been described, these embodiments have been presented by way of example only, and are not intended to limit the scope of the disclosure. Indeed, the novel apparatus, methods, and systems described herein may be embodied in a variety of other forms; furthermore, various omissions, substitutions and changes in the form of the methods and systems described herein may be made without departing from the spirit of the disclosure. For example, while blocks are presented in a given arrangement, alternative embodiments may perform similar functionalities with different components and/or circuit topologies, and some blocks may be deleted, moved, added, subdivided, combined, and/or modified. Each of these blocks may be implemented in a variety of different ways. Any suitable combination of the elements and acts of the various embodiments described above can be combined to provide further embodiments. The accompanying claims and their equivalents are intended to cover such forms or modifications as would fall within the scope and spirit of the disclosure.

What is claimed is:

1. A microelectronic device comprising:

a first semiconductor element having a first substrate;

a second semiconductor element having a second substrate, the second semiconductor element directly bonded to the first semiconductor element without an intervening adhesive; and an electromagnetic coil, wherein a first coil portion of the electromagnetic coil and a second coil portion of the electromagnetic coil are spaced apart by at least the first substrate of the first semiconductor element, and wherein a first conductive via extending through the first semiconductor element connects the first and second coil portions of the electromagnetic coil.

2. The microelectronic device of claim 1, wherein the electromagnetic coil is configured to operate as an inductor.

3. The microelectronic device of claim 1, wherein the electromagnetic coil is configured to operate as an autotransformer.

4. The microelectronic device of claim 1, wherein the electromagnetic coil is configured to operate as part of a transformer.

5. The microelectronic device of claim 1, wherein the direct bonds between the first and second semiconductor elements comprises conductor-to-conductor and dielectric-to-dielectric hybrid bonds.

6. The microelectronic device of claim 1, wherein the first coil portion of the electromagnetic coil is disposed in a back end of line (BEOL) layer associated with the first semiconductor element.

7. The microelectronic device of claim 1, wherein the first coil portion of the electromagnetic coil is disposed in an outermost metallization layer of a back end of line (BEOL) layer associated with the first semiconductor element.

8. The microelectronic device of claim 1, wherein the second coil portion of the electromagnetic coil is disposed in a back end of line (BEOL) layer associated with the second semiconductor element.

9. The microelectronic device of claim 1, wherein the second coil portion of the electromagnetic coil is disposed in an outermost metallization layer of a back end of line (BEOL) layer associated with the second semiconductor element.

10. The microelectronic device of claim 1, wherein the second semiconductor element is disposed on a surface of the first semiconductor element, and wherein the second coil portion of the electromagnetic coil is disposed in a metallization layer on the surface of the first semiconductor element.

11. The microelectronic device of claim 1, wherein the second coil portion of the electromagnetic coil is disposed in a second bonding layer which directly bonds an associated BEOL layer of the second semiconductor element to the first semiconductor element.

12. The microelectronic device of claim 1, further comprising a third semiconductor element disposed on the second semiconductor element, wherein a third coil portion of the electromagnetic coil is spaced apart from the second coil portion of the electromagnetic coil by at least the second substrate of the second semiconductor element, and wherein a second conductive via extending through the second semiconductor element connects the second and third coil portions of the electromagnetic coil.

13. A microelectronic device comprising:

a first semiconductor element having a first substrate;

a second semiconductor element having a second substrate, the second semiconductor element directly bonded to the first semiconductor element without an intervening adhesive;

a first electromagnetic coil adjacent to the first substrate of the first semiconductor element, and a second electromagnetic coil adjacent to the second substrate of the second semiconductor element, wherein the first electromagnetic coil and the second electromagnetic coil are spaced apart by at least the first substrate of the first semiconductor element, and wherein at least one of the first electromagnetic coil and the second electromagnetic coil is disposed in a layer configured for direct bonding.

14. The microelectronic device of claim 13, wherein the second electromagnetic coil is disposed in a bonding layer which directly bonds an associated BEOL layer of the second semiconductor element to the first semiconductor element.

15. The microelectronic device of claim 13, wherein the first electromagnetic coil is disposed in an outermost metallization layer of a back end of line (BEOL) layer associated with the first semiconductor element.

16. A method of forming a microelectronic device, the method comprising:

providing a first semiconductor element and a first coiled structure adjacent to the first semiconductor element, a first conductive via extending through the first semiconductor element;

providing a second semiconductor element and a second coiled structure adjacent to the second semiconductor element; and directly bonding the second semiconductor element to the first semiconductor element without an intervening adhesive, such that the first coiled structure and the second coiled structure are connected by the first conductive via forming an electromagnetic coil, the first coiled structure and the second coiled structure spaced apart by the first semiconductor element.

17. The microelectronic device of claim 13, wherein direct bonds between the first and second semiconductor elements comprise conductor-to-conductor and dielectric-to-dielectric hybrid bonds.

18. The method of claim 16, wherein directly bonding the second semiconductor element to the first semiconductor element without an intervening adhesive comprises forming conductor-to-conductor and dielectric-to-dielectric hybrid bonds.

19. The method of claim 16, wherein the electromagnetic coil is configured to operate as an inductor.

20. The method of claim 16, wherein the electromagnetic coil is configured to operate as a transformer.

* * * * *